United States Patent
Tu et al.

(10) Patent No.: US 12,085,865 B2
(45) Date of Patent: *Sep. 10, 2024

(54) SYSTEM AND METHOD FOR DETECTING DEBRIS IN A PHOTOLITHOGRAPHY SYSTEM

(71) Applicant: Taiwan Semiconductor Manufacturing Co., Ltd., Hsinchu (TW)

(72) Inventors: Shih-Yu Tu, Hsinchu (TW); Chieh Hsieh, Hsinchu (TW); Shang-Chieh Chien, Hsinchu (TW); Li-Jui Chen, Hsinchu (TW); Heng-Hsin Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/324,889

(22) Filed: May 26, 2023

(65) Prior Publication Data

US 2023/0296992 A1 Sep. 21, 2023

Related U.S. Application Data

(63) Continuation of application No. 17/484,945, filed on Sep. 24, 2021, now Pat. No. 11,693,324.

(Continued)

(51) Int. Cl.
*G03F 7/00* (2006.01)
*H05G 2/00* (2006.01)

(52) U.S. Cl.
CPC ........ *G03F 7/7085* (2013.01); *G03F 7/70033* (2013.01); *G03F 7/70916* (2013.01);
(Continued)

(58) Field of Classification Search
CPC .............. G03F 7/7085; G03F 7/70033; G03F 7/70925; G03F 7/70858–70866;
(Continued)

(56) References Cited

U.S. PATENT DOCUMENTS

| 11,693,324 B2 * | 7/2023 | Tu | G03F 7/7085 |
| | | | 355/30 |
| 2010/0045948 A1 * | 2/2010 | Kraus | G01N 21/55 |
| | | | 355/30 |

(Continued)

FOREIGN PATENT DOCUMENTS

DE 102017205452 A1 * 6/2017
DE 102017207458 A1 * 12/2017

OTHER PUBLICATIONS

English translation of DE-102017207458 (Year: 2017).*
English translation of DE-102017205452-A1. (Year: 2017).*

*Primary Examiner* — Christina A Riddle
(74) *Attorney, Agent, or Firm* — Seed IP Law Group LLP

(57) ABSTRACT

An extreme ultraviolet (EUV) photolithography system detects debris travelling from an EUV generation chamber to a scanner. The photolithography system includes a detection light source and a sensor. The detection light source outputs a detection light across a path of travel of debris particles from the EUV generation chamber. The sensor senses debris particles by detecting interaction of the debris particles with the detection light.

20 Claims, 14 Drawing Sheets

Figure 1

Related U.S. Application Data

(60) Provisional application No. 63/163,401, filed on Mar. 19, 2021.

(52) U.S. Cl.
CPC ......... *G03F 7/70925* (2013.01); *H05G 2/005* (2013.01); *H05G 2/008* (2013.01)

(58) Field of Classification Search
CPC . G03F 7/70883; G03F 7/70908–70941; G03F 7/70975; G03F 7/70983; G03F 7/70991; G03F 7/708; G03F 7/70808; H05G 2/005; H05G 2/003; H05G 2/00–008; G01N 21/94
USPC .................................. 355/30, 52–55, 67–77
See application file for complete search history.

(56) References Cited

U.S. PATENT DOCUMENTS

| | | | |
|---|---|---|---|
| 2010/0192973 A1 | 8/2010 | Ueno et al. | |
| 2013/0313423 A1* | 11/2013 | Umstadter | G01T 1/16 250/282 |
| 2014/0028989 A1* | 1/2014 | Butscher | G03G 15/00 356/338 |
| 2016/0225610 A1* | 8/2016 | Chien | G03F 7/70916 |
| 2016/0234920 A1* | 8/2016 | Suzuki | H05G 2/003 |
| 2020/0105431 A1* | 4/2020 | Liu | H05G 2/008 |
| 2020/0178380 A1* | 6/2020 | Chen | G03F 7/70033 |

\* cited by examiner

SYSTEM AND METHOD FOR DETECTING DEBRIS IN A PHOTOLITHOGRAPHY SYSTEM

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features in an integrated circuit are produced, in part, with the aid of photolithography. Traditional photolithography techniques include generating a mask outlining the pattern of features to be formed on an integrated circuit die. The photolithography light source irradiates the integrated circuit die through the mask. The size of the features that can be produced via photolithography of the integrated circuit die is limited, in part, on the lower end, by the wavelength of light produced by the photolithography light source. Smaller wavelengths of light can produce smaller feature sizes.

Extreme ultraviolet (EUV) light is used to produce particularly small features due to the relatively short wavelength of EUV light. For example, EUV light is typically produced by irradiating droplets of selected materials with a laser beam. The energy from the laser beam causes the droplets to enter a plasma state. In the plasma state, the droplets emit EUV light. The EUV light travels toward a collector with an elliptical or parabolic surface. The collector reflects the EUV light to a scanner. The scanner illuminates the target with the EUV light via a reticle. However, due to the miniscule size of features to be transferred from the reticle to the integrated circuits, if even very small particles or debris fall onto the reticle, then the photolithography processes may be corrupted and the resulting integrated circuits will not be functional.

Figure 1:
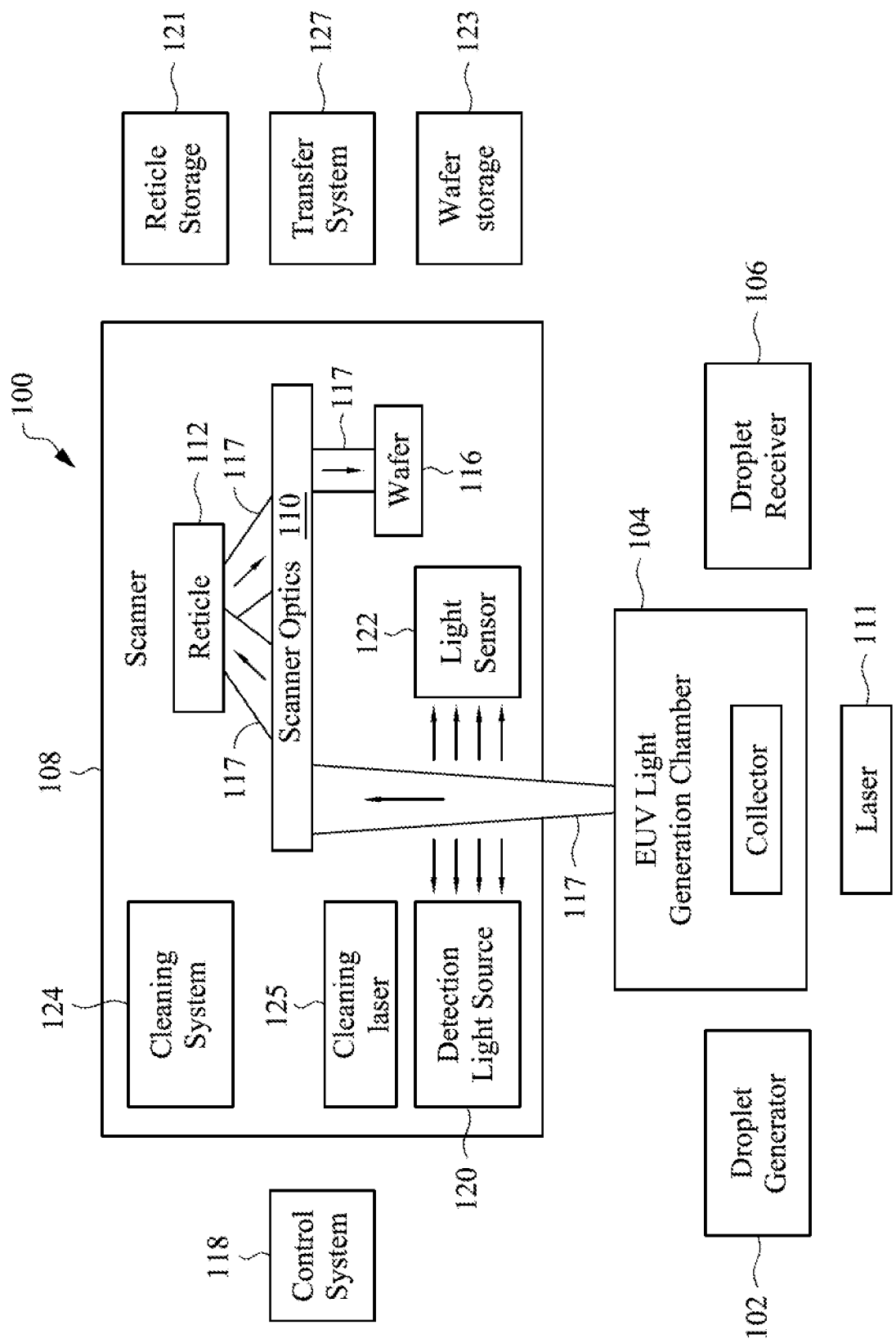
FIG. 1 is a block diagram of an EUV photolithography system, in accordance with some embodiments.

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide many benefits to EUV photolithography systems. Embodiments of the present disclosure utilize light sensors to detect debris particles within an EUV photolithography system. A detection light source and a light sensor are positioned within a scanner of the EUV photolithography system. The detection light source emits a detection light in a path of travel of debris particles from an EUV light generation chamber. When the debris particles pass through the detection light, the light sensor detects that the debris particle have passed through the light. The EUV system can determine in real time how many particles are passing from the EUV generation chamber into the scanner. This provides several benefits. For example, upon detecting a high rate of debris particles passing into the scanner, the EUV system can adjust EUV generation parameters in real time to reduce the number of debris particles. Additionally, the EUV photolithography system can automatically initiate cleaning processes to clean one or more of an EUV reticle, optical equipment within the scanner, or a collector within the EUV generation chamber before large amounts of debris particles have accumulated. This can avoid more expensive and time consuming cleaning procedures to clean the reticle or other equipment. Furthermore, photolithography processes are properly performed, leading to increases in wafer yields and better performance of integrated circuits.

FIG. 1 is a block diagram of an EUV photolithography system 100, according to some embodiments. The components of the EUV photolithography system 100 cooperate to generate EUV light and perform photolithography processes. As will be set forth in more detail below, the components of the photolithography system utilize light-based detection techniques to detect debris particles during EUV light generation processes. As used herein, the terms "EUV light" and "EUV radiation" can be used interchangeably.

The EUV photolithography system 100 includes a droplet generator 102, an EUV light generation chamber 104, a droplet receiver 106, a scanner 108, and a laser 111. The droplet generator 102 outputs droplets into the EUV light generation chamber 104. The laser 111 irradiates the droplets with pulses of laser light within the EUV light generation chamber 104. The irradiated droplets emit EUV light 117. The EUV light 117 is collected by a collector 114 and reflected toward the scanner 108. The scanner 108 conditions the EUV light 117, reflects the EUV light 117 off of a reticle 112 including a mask pattern, and focuses the EUV light 117 onto the wafer 116. The EUV light 117 patterns a layer on the wafer 116 in accordance with a pattern of the reticle 112. Each of these processes is described in more detail below.

The droplet generator 102 generates and outputs a stream of droplets. The droplets can include tin, though droplets of other material can be utilized without departing from the scope of the present disclosure. The droplets move at a high rate of speed toward the droplet receiver 106. The droplets have an average velocity between 60 m/s to 200 m/s. The droplets have a diameter between 10 µm and 200 µm. The generator may output between 1000 and 100000 droplets per second. The droplet generator 102 can generate droplets having different initial velocities and diameters than those described above without departing from the scope of the present disclosure.

In some embodiments, the EUV light generation chamber 104 is a laser produced plasma (LPP) EUV light generation system. As the droplets travel through the EUV light generation chamber 104 between the droplet generator 102 and the droplet receiver 106, the droplets are irradiated by the laser 111. When a droplet is irradiated by the laser 111, the energy from the laser 111 causes the droplet to form a plasma. The plasmatized droplets generate EUV light 117. This EUV light 117 is collected by the collector 114 and passed to the scanner 108 and then on to the wafer 116.

In some embodiments, the laser 111 is positioned external to the EUV light generation chamber 104. During operation, the laser 111 outputs pulses of laser light into the EUV light generation chamber 104. The pulses of laser light are focused on a point through which the droplets pass on their way from the droplet generator 102 to the droplet receiver 106. Each pulse of laser light is received by a droplet. When the droplet receives the pulse of laser light, the energy from the laser pulse generates a high-energy plasma from the droplet. The high-energy plasma outputs EUV light 117.

In some embodiments, the laser 111 irradiates the droplet with two pulses. A first pulse causes the droplet to flatten into a disk like shape. The second pulse causes the droplet to form a high temperature plasma. The second pulse is significantly more powerful than the first pulse. The laser 111 and the droplet generator 102 are calibrated so that the laser emits pairs of pulses such that the droplet is irradiated with a pair of pulses. The laser can irradiate droplets in a manner other than described above without departing from the scope of the present disclosure. For example, the laser 111 may irradiate each droplet with a single pulse or with more pulses than two. In some embodiments, there are two separate lasers. A first laser delivers the flattening pulse. A second laser delivers the plasmatizing pulse.

In some embodiments, the light output by the droplets scatters randomly in many directions. The photolithography system 100 utilizes the collector 114 to collect the scattered EUV light 117 from the plasma and direct or output the EUV light 117 toward the scanner 108.

The scanner 108 includes scanner optics 110. The scanner optics 110 include a series of optical conditioning devices to direct the EUV light 117 to the reticle. The scanner optics 110 may include refractive optics such as a lens or a lens system having multiple lenses (zone plates). The scanner optics 110 may include reflective optics, such as a single mirror or a mirror system having multiple mirrors. The scanner optics 110 direct the ultraviolet light from the EUV light generation chamber 104 to a reticle.

The ultraviolet light reflects off of the reticle 112 back toward further optical features of the scanner optics 110. In some embodiments, the scanner optics 110 include a projection optics box. The projection optics box may have refractive optics, reflective optics, or combination of refractive and reflective optics. The projection optics box may include a magnification less than 1, thereby reducing the patterned image included in the EUV light 117 reflected from the reticle. The projection optics box directs the EUV light 117 onto the wafer 116, for example, a semiconductor wafer.

The EUV light 117 includes a pattern from the reticle. In particular, the reticle includes the pattern to be defined in the wafer 116. After the EUV light 117 reflects off of the reticle, the EUV light 117 contains the pattern of the reticle. A layer of photoresist typically covers the target during extreme ultraviolet photolithography irradiation. The photoresist assists in patterning a surface of the semiconductor wafer in accordance with the pattern of the reticle.

The effectiveness of the photolithography processes depend, in part, on the amount of EUV light is generated, how much of the EUV light reaches the reticle 112, and how effectively the EUV light 117 carries the pattern of the reticle 112 after reflecting from the reticle 112. If any of these aspects of the photolithography process are negatively affected, then the photolithography process itself may be less effective or ineffective.

As set forth above, the EUV light 117 carries the pattern of the reticle 112 after reflecting from the reticle 112. However, if there are debris particles on the surface of the reticle 112, then the EUV light 117 will not properly carry the pattern of the reticle 112 to the wafer 116. Instead, the EUV light 117 will carry a pattern that includes the shape of the debris particles present on the exposure surface of the reticle 112. Due to the very small size of features in the pattern of the reticle 112, even a few very small debris particles can heavily affect the pattern carried by the EUV light 117. Accordingly, it is very beneficial to prevent the accumulation of debris on the reticle 112. While the description herein focuses on contamination of the reticle 112, the scanner optics 110 are also sensitive to contamination by the debris particles. As the scanner optics 110 can include a series of precision mirrors and lenses to condition and direct the EUV light 117 to the reticle 112 and to the wafer 116, contamination of the surfaces of the scanner optics 110 can also result in the EUV light 117 not reaching the wafer 116 with the appropriate pattern of the reticle 112.

The droplets utilized to generate EUV light 117 are one source of contamination for the reticle 112. In particular, it is possible that particles may break off of the droplets in the EUV light generation chamber 104 due to the position, timing, and energy of the flattening and plasmatizing laser pulses and based on the speed, size, and spacing of the droplets. The particles that break off from the droplets may travel from the EUV light generation chamber 104 into the scanner 108 along the same path taken by the EUV light 117. Once the droplet particles enter the scanner 108, it is possible that the droplet particles will impact the scanner optics 110 or the reticle 112. The droplet particles may adhere to or accumulate on the surfaces of the scanner optics 110 and the reticle 112. Thus, the droplet particles correspond to debris particles that contaminate the surfaces of the scanner optics 110 and the reticle 112. While the description herein focuses primarily on debris particles from the droplets, debris particles from sources other than the droplets can travel from the EUV light generation chamber 104 into the scanner 108.

In order to detect debris or particles traveling from the EUV light generation chamber 104, the EUV photolithography system 100 includes a detection light source 120 and a light sensor 122. The detection light source 120 emits detection light into the path of travel of debris particles from the EUV light generation chamber 104 to the scanner 108. As the debris particles pass through or are irradiated by the detection light, the debris particles interact with the detection light. The light sensor 122 senses the interaction of the debris particles with the detection light. In this way, the detection light source 120 and the light sensor 122 cooperate to detect debris particles traveling from the EUV light generation chamber 104 into the scanner 108.

As used herein, "interaction" of the debris particles with the detection light can include debris particles interrupting the detection light, debris particles reflecting the detection light, debris particles absorbing the detection light, and debris particles emitting light after absorbing the detection light. As used herein, "detection light" refers to light emitted by the detection light source 120 in order to enable the light sensor 122 to detect debris particles. Further details regarding the detection light source 120 and the light sensor 122 are provided below.

In some embodiments, the detection light source 120 is placed within the scanner 108 at a location adjacent to a connection point between the EUV light generation chamber 104 and the scanner 108. While FIG. 1 illustrates the EUV light generation chamber 104 as separated by a gap from the scanner 108, in practice, a portion of the EUV light generation chamber 104 may protrude into the scanner 108. The EUV light generation chamber 104 may include an intermediate focus corresponding to a narrow aperture through which EUV light 117 exits the EUV light generation chamber 104 and enters the scanner 108.

The detection light source 120 may be positioned within the scanner 108 adjacent to the intermediate focus or another aperture through which EUV light 117 passes from the EUV light generation chamber 104 into the scanner 108. The detection light source 120 may be positioned within the scanner 108 adjacent to the aperture to facilitate the precise counting of the number of particles passing from the EUV light generation chamber 104 into the scanner 108 because all particles passing from the EUV light generation chamber 104 into the scanner 108 will pass through the connecting aperture. Alternatively, the detection light source 120 may be positioned within the EUV light generation chamber 104 adjacent to the intermediate focus or aperture.

The light sensor 122 may be positioned adjacent to the detection light source 120. Accordingly, if the detection light source 120 is positioned within the scanner 108, the light sensor 122 may also be positioned within the scanner 108. If the detection light source is positioned within the EUV light generation chamber 104, the light sensor 122 may also be positioned within the EUV light generation chamber 104. Various positions and arrangements of the detection light source 120 and the light sensor 122 can be utilized without departing from the scope of the present disclosure.

In some embodiments, the detection light source 120 includes a laser that emits detection light toward the light sensor 122. The amount of detection light received by the light sensor 122 provides an indication of debris particles passing between the detection light source 120 and the light sensor 122. Each time that a debris particle passes between the detection light source and the light sensor 122, the detection light received by the light sensor 122 will be partially interrupted. This will be detected by the light sensor as a momentary decrease in the amount of detection light received by the light sensor 122. The light sensor 122 or the control system 118 communicatively coupled to the light sensor 122 can count the number of particles based on the number of interruptions or decreases in the detection light received by the light sensor 122. The light sensor 122 can include any type of sensor capable of detecting light received from the detection light source 120. In some examples, the light sensor 122 may include a photodiode, a charge coupled device, or other types of light sensors.

In some cases, the light sensor 122 may include a large number of very small pixels or individual light sensors. The shape and size of the debris particles can be detected based on the position of individual pixels or light sensors for which detection light is blocked as the debris particles passed between the detection light source 120 and the light sensor 122. The laser used by the detection light source 120 may emit detection light in the EUV spectrum, the UV spectrum, the visible spectrum, the near infrared spectrum, the infrared spectrum, the microwave spectrum, or another spectrum. Accordingly, the detection light may include electromagnetic radiation of any suitable frequency or wavelength.

In some embodiments, the detection light source can include one or more light emitting diodes (LED). The LEDs can emit detection light into the path of travel of debris particles into the scanner 108. The debris particles absorb some of the detection light. The debris particles then emit their own light. The emitted light will have wavelengths characteristic of the material of the debris particle. For example, electrons in the debris particle may absorb some of the detection light and transition from a low energy level to a higher energy level. The electrons may then decay from the higher energy level to a lower energy level and may emit a photon having an energy corresponding to the difference between the higher energy level and the lower energy level. This energy is characteristic of the material of the debris particle that absorbs the detection light. The light sensor 122 detects the light emitted by the excited debris particle. The light sensor 122, or the control system 118 analyzes the spectrum of light emitted by the debris particle to determine the material of the debris particle. The light sensor 122 can detect debris particles and determine the material of the debris particles. The light sensor 122 can determine whether the debris particles are from the droplets or from another source.

The detection light source 120 may include a combination of light sources. For example, the detection light source 120 may include both lasers and LEDs. The light sensor 122 may include a combination of sensors that detect interruption in the detection light and sensors that detect light emitted from the debris particles.

In some embodiments, the control system 118 is communicatively coupled to the light sensor 122. The light sensor 122 outputs sensor signals or sensor data to the control system 118. The control system 118 can analyze the sensor signals or sensor data provided by the light sensor 122. The control system 118 may analyze the sensor signals in order to determine the number of debris particles passing from the EUV light generation chamber 104 into the scanner 108. The control system 118 may analyze the sensor signals to determine the rate, in terms of particles per second, for example, at which debris particles are traveling into the scanner 108. The control system 118 may also analyze the sensor signals to determine the velocity or energy of debris particles passing into the scanner 108 from the EUV light generation chamber 104. The control system 118 may analyze the sensor signals in order to determine the type of debris particles traveling from the EUV light generation chamber 104 to the scanner 108. The control system 118 may analyze the sensor signals to determine the material of the debris particles based on the spectrum of light received by the light sensor 122. The control system 118 may analyze the sensor signals to determine the size of the debris particles. The control system 118 may include processing resources, memory resources, and communication resources to perform these functions. The light sensor 122 may also perform some or all of the functions described above as being performed by the control system 118.

The detection light source 120 and the light sensor 122 can utilize Mie scattering to determine the size of debris particles. Mie scattering formulas may approximate a debris particle as a sphere or a stratified sphere. Mie scattering techniques may be particularly useful when the size of the debris particle is comparable to the wavelength of the detection light emitted by the detection light source. In this case, the detection light source 120 may include an ultraviolet light source that emits detection light with wavelengths less than 100 nm. Utilizing Mie scattering techniques, debris particles with sizes less than 100 nm can be detected and their sizes can be accurately estimated. Accordingly, system resolution can be less than 100 nm with the assistance of me scattering techniques. Mie scattering techniques can be implemented with arrays of light sensors 122 and the control system 118 utilizing Mie scattering formulas to determine the size of debris particles.

The detection light source 120 and the light sensor 122 can utilize Rayleigh scattering to detect debris particles and to determine the size of debris particles. Rayleigh scattering may be particularly useful in determining the size of debris particles that are significantly smaller than the wavelength of the detection light. Accordingly, the detection light source 120, the light sensor 122, and the control system 118 can collectively utilize Rayleigh scattering techniques to determine the size of debris particles that are very small. In some embodiments, Rayleigh scattering techniques may detect particle sizes much smaller than 100 nm.

The detection light source 120 and the light sensors 122 may utilize particle image velocimetry (PIV) and particle tracking velocimetry (PTV) to determine the sizes of particles. PIV and PTV techniques are traditionally used to determine the velocity of a fluid by detecting the presence and trajectory of the seed particles within the fluid. These techniques can also be utilized to detect debris particles. The debris particles are treated as expected seed particles. Debris particles of sizes less than 50 nm can be detected utilizing PIV and PTV techniques. Debris particles less than 400 nm can be detected using PIV and PTV techniques. Debris particles with sizes between 100 nm and 1 µm can be detected using PIV and PTV techniques. Debris particles with sizes between 1 µm and 10 µm can be detected using PIV and PTV techniques. Debris particles larger than these ranges can also be detected utilizing PIV and PTV techniques.

The detection light source 120 and the light sensors 122 can utilize polarization/non-polarization techniques to further increase the resolution of debris particle detection. For example, the detection light source 120 may emit unpolarized light. Light that passes through a debris particle will be unpolarized upon reaching the light sensors 122. Detection light that is scattered from a debris particle may be polarized. Accordingly, detection of scattered polarized light can indicate the presence of a debris particle. Very small debris particles can be detected in this manner. Various other polarization/non-polarization techniques can be utilized to detect the presence and size of very small debris particles.

It is very beneficial to know the numbers of debris particles traveling into the scanner 108. For example, if the control system 118 determines that a large number of droplet particles are traveling into the scanner 108, the control system 118 can take measures to reduce the number of droplet particles traveling into the scanner 108. As described previously, the amount of droplet debris that is generated during EUV generation is based, in part, on the parameters of the laser 111 and the droplets. Generation of droplet debris may indicate that EUV generation parameters are suboptimal. The control system 118 can take steps to improve EUV generation and reduce the amount of droplet debris. These steps can include adjusting the timing of the flattening and plasmatizing pulses from the laser 111, adjusting the energy of the flattening and plasmatizing pulses from the laser 111, adjusting the position or orientation of the laser 111, adjusting the velocity of droplets, adjusting the size of droplets, adjusting the timing or frequency of outputting droplets, or adjusting other parameters associated with generating EUV light 117. These measures can be taken in order to avoid contamination of the reticle 112 or sensitive scanner optics 110. These measures can reduce destruction of the precleaning, repair, and replacement of the scanner optics 110 of the reticle 112. Accordingly, it is very beneficial to know the types and numbers of debris particles entering the scanner 108.

The control system 118 is communicatively coupled to the droplet generator 102 and the laser 111. The control system 118 can control the operation of the droplet generator 102 and the laser 111. The control system 118 can adjust operating parameters of the droplet generator 102 and the laser 111.

The EUV photolithography system 100 also includes a cleaning system 124. The cleaning system 124 can clean the scanner optics 110 and the reticle 112. The cleaning system may utilize a plurality of cleaning fluids to clean the scanner optics 110 and the reticle 112. The cleaning system 124 can flow the cleaning fluids responsive to detection of debris particles by the light sensor 122. The cleaning fluids may clean debris particles from the surfaces of the scanner optics 110 and the reticle 112.

The control system 118 may control the cleaning system 124 to perform a particular type of cleaning based on the number and types of detect particles. For example, for organic particles or general rigid debris particles, the control system 118 can cause the cleaning system 124 to output cleaning gases utilizing mass flow controllers, fans, blowers, or other flow in hardware. The cleaning system 124 can flow in a gas into the environment of the scanner 108 or into the environment of the EUV light generation chamber 104. The cleaning gases can interact with and dissolve particles on the surfaces of the scanner optics 110, the reticle 112, the collector 114, or other interior surfaces of the light generation chamber 104 of the scanner 108. The cleaning system 124 can include filters to filter out debris an unwanted gasses or fluids from the scanner 108 and the EUV light generation chamber 104.

The control system 118 can cause the cleaning system 124 to output cleaning liquids based on the type of debris particles. For example, for highly viscous particles or polarize particles (particles that carry a net charge) the control system 118 can control the cleaning system 124 to output cleaning liquids. The cleaning liquids can include chemical solutions, water, acetone, or isopropyl alcohol. The cleaning system 124 can include filters to filter out debris. The cleaning system 124 may include components to spray or otherwise flow liquid directly onto the reticle 112 in the scanner optics 110.

While the cleaning system 124 is shown as being housed in the scanner 108, in practice, the cleaning system 124 includes disparate components and systems. Some of the components may be positioned in the scanner 108. Some of the components may be positioned external to the scanner 108 and external to the EUV light generation chamber 104. Some of the components may be positioned in dedicated cleaning chambers for cleaning the reticle 112 or the scanner optics 110. The reticle 112, portions of the scanner optics 110, and the wafer 116 may be transferred to the dedicated cleaning chambers. There may be separate cleaning chambers or cleaning areas for the reticle, for the scanner optics 110, and for the wafer 116.

In some embodiments, the cleaning system 124 may flow clean dry air (CDA) to generally clean the interiors of the scanner 108 and the EUV light generation chamber 104. The CDA may include molecular nitrogen ($N_2$) and molecular oxygen ($O_2$). The CDA may be particularly useful for cleaning debris particles with low coefficients of viscosity that are loosely positioned on the scanner optics 110, the reticle 112, the wafer 116, or interior surfaces of the scanner 108 and the EUV light generation chamber 104. In some embodiments, cleaning system 124 may flow pure $O_2$ gas to clean low viscosity particles from lenses and mirrors of the scanner optics 110.

In some embodiments, the cleaning system 124 may flow hydrogen gas (H) to clean components of the scanner 108 in the EUV light generation chamber 104. This may be particularly effective for cleaning carbon particles. The hydrogen gas may be ionized. The hydrogen gas may react with carbon-based debris particles to remove the debris particles from surfaces and components within the scanner 108 and the EUV light generation chamber 104.

The control system 118 may cause the cleaning system 124 to flow isopropyl alcohol to clean oil-based particles or debris accumulations. The cleaning system 124 may also utilize wiping components to wipe surfaces of the reticle 112, the scanner optics 110, or surfaces of the scanner 108 and the EUV light generation chamber 104.

The control system may cause the cleaning system 124 to flow acetone the clean plastic and organic compounds. The cleaning system 124 may also utilize wiping components to wipe surfaces of the reticle 112, the scanner optics 110, or other surfaces of the scanner 108 and the EUV light generation chamber 104.

The control system 118 may cause the cleaning system 124 to flow highly purified deionized water for general cleaning of the reticle 112, the scanner optics 110, and surfaces of the scanner 108 and the EUV light generation chamber 104.

The control system 118 may cause the cleaning system 124 to flow into gases to generate a high dense cooling flow to clean the wafer 116. The inert gases may include argon and molecular nitrogen. The cleaning system 124 may clean the wafer 116 within the scanner or in a separate cleaning chamber.

The EUV photolithography system 100 may also include a cleaning laser 125. The cleaning laser 125 may be utilized to disrupt the trajectory of debris particles that enter the scanner 108. The cleaning laser 125 may also be utilized to destroy debris particles that enter the scanner. The cleaning laser 125 may include a high power laser that impacts debris particles. The impact of the high power laser on the debris particles may cause the debris particles to change trajectory or to entirely dissolve. The cleaning laser 125 may be part of the cleaning system 124. Alternatively, the cleaning laser 125 may be part of the detection light source 120.

The cleaning laser 125 may include a single spot cleaning laser. The spot cleaning laser may focus on a single point through which debris particles pass. When the debris particles pass the focus or beam of the spot cleaning laser, the debris particles are either destroyed or the trajectory is altered to ensure that they do not impact sensitive scanner optics 110 or surfaces of the reticle's 112.

The cleaning laser 125 may include an array of cleaning lasers. The array of cleaning lasers may be arranged to cover a line (one dimensional defense), a plane (two dimensional defense), or a volume (three dimensional defense). One or more of the cleaning lasers 125 may translate or rotate or otherwise move to impart a scanning effect in which the beam of a single laser covers a large area because the laser is moving the translation or rotation.

The cleaning laser 125 may include a plurality of lasers that each focus on the particular spot in order to provide very effective debris prevention. Debris that passes through any of the focus spots will be destroyed or diverted. Various arrangements of the cleaning agent 125 may be utilized without departing from the scope of the present disclosure.

The EUV system 100 includes a reticle storage 121. The reticle storage 121 may include a storage and protection pod that encloses and protects the reticle 112 when the reticle 112 is not in use. After the reticle 112 has been initially manufactured, the reticle 112 may immediately be enclosed in the reticle storage 121. The reticle 112 remains in the reticle storage 121 during transport from the manufacturing site to the wafer processing site. The reticle storage 121 may provide very strong protection against contaminants when the reticle 112 is not in use. However, the reticle storage 121 does not protect the reticle 112 when the reticle 112 is loaded into the scanner 108.

The reticle 112 remains in the reticle storage 121 until the reticle 112 is to be utilized in the EUV photolithography process. At this time, the reticle 112 is transferred from the reticle storage 121 into the scanner 108. The reticle storage 121, or portions of the reticle storage 121 may be carried into the scanner 108. The reticle 112 is then unloaded from the reticle storage onto a chuck (not shown) in the scanner 108. The chuck holds the reticle 112 during the EUV process. After the EUV process, the reticle 112 is unloaded from the chuck to the reticle storage 121.

The EUV photolithography system 100 includes a wafer storage 123. The wafer storage 123 stores wafers 116 when the wafers are not in use. The wafer storage 123 may include storage for wafers 116 that have yet to be transferred into the scanner 108 for patterning. The wafer storage may include storage for wafers 116 that have already been patterned within the scanner 108.

The EUV system 100 includes a transfer system 127. The transfer system 127 may include one or more robot arms. The one or more robot arms can transfer the reticle 112 between the scanner 108, the reticle storage 121, a reticle scanner, and a reticle cleaning station. The one or more robot arms can also transfer wafers 116 between the scanner 108 and the wafer storage 123. In some embodiments, robot arms that transfer wafers 116 are separate from robot arms that transfer the reticle 112. The EUV system 100 can include other types of reticle transport systems without departing from the scope of the present disclosure.

Figure 2A:
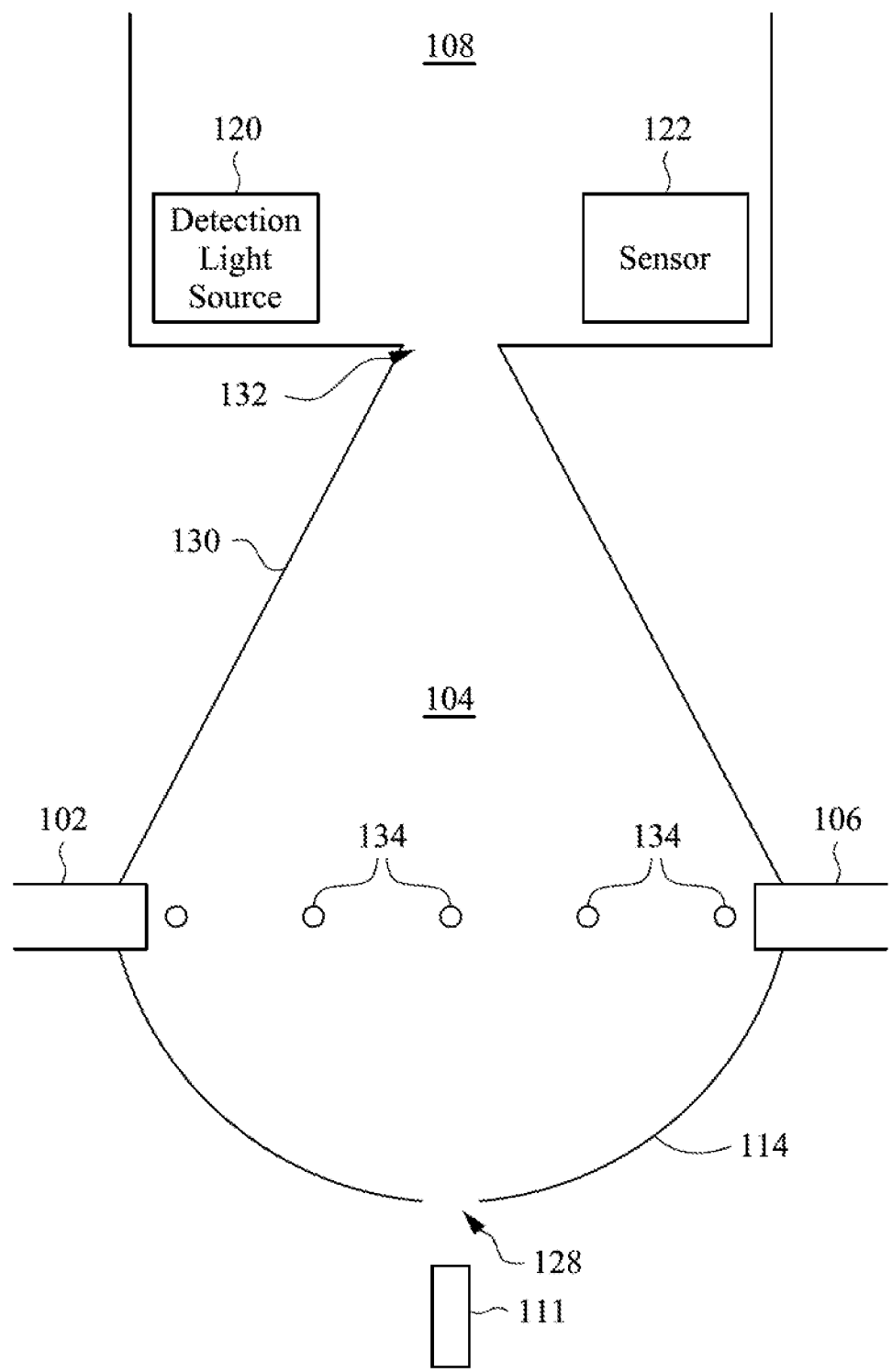
FIGS. 2A and 2B are illustrations of an EUV photolithography system, in accordance with some embodiments.
Figure 2B:
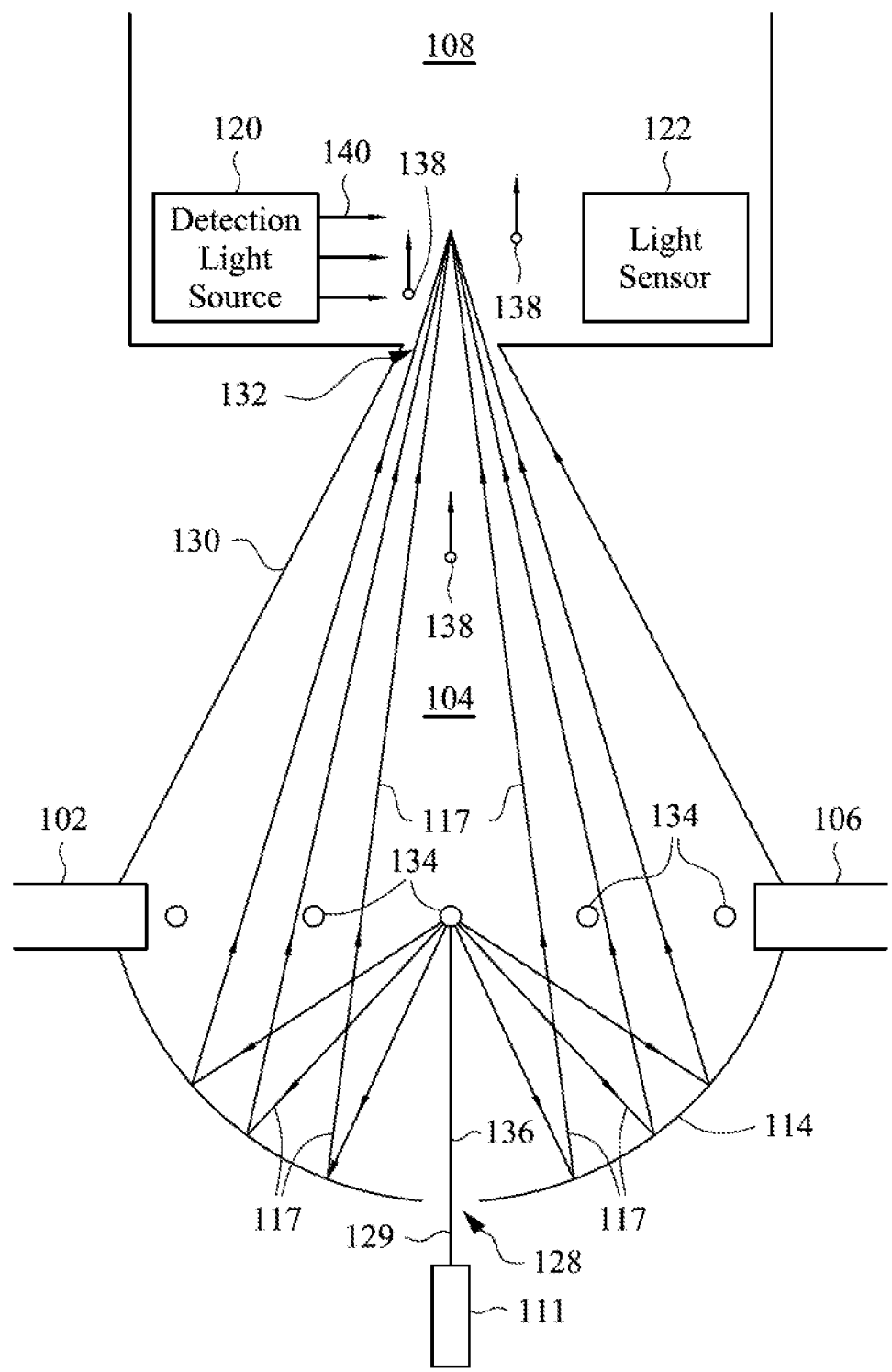

FIGS. 2A-2B are illustrations of a photolithography system 200, according to an embodiment. The photolithography system 200 is an extreme ultraviolet photolithography system that generates extreme ultraviolet radiation by laser plasma interaction. The plasma can be generated in a substantially similar manner as described in relation to FIG. 1. FIG. 2A illustrates the photolithography system 200 without the extreme ultraviolet radiation. FIG. 2B illustrates the photolithography system 200 with the extreme ultraviolet radiation.

With reference to FIG. 2A, the photolithography system 200 includes a plasma generation chamber 104, a laser 111, a collector 114, a droplet generator 102, and a droplet receiver 106. The EUV light generation chamber 104 is defined by the collector 114 and an enclosure 130 coupled to the collector 114. The components of the photolithography system 200 cooperate together to generate extreme ultraviolet radiation and to perform photolithography processes with the extreme ultraviolet radiation.

The collector 114 forms the bottom of the EUV light generation chamber 104. The conical enclosure 130 is coupled to the collector 114 and forms the top portion of the EUV light generation chamber 104. The conical enclosure 130 includes an aperture 132. The aperture 132 corresponds to an opening from the EUV light generation chamber 104 to the scanner 108. Accordingly, the aperture 132 enables EUV light 117 (see FIG. 2B) to travel from the EUV light generation chamber 104 to the scanner 108. The aperture 132 corresponds to an intermediate focus of the collector 114. The positioning of the aperture 132 relative to the collector 114 places the aperture 132 roughly at an intermediate focal point of the collector 114.

The detection light source 120 and the sensor 122 are positioned within the scanner 108 adjacent to the aperture 132. Alternatively, the detection light source 120 and the light sensor 122 may be positioned deeper within the scanner 108. In practice, there may be detection light sources 120 and light sensors 122 positioned at various locations within the scanner 108. FIG. 2A does not illustrate the scanner optics 110 or the reticle 112.

The droplet generator 102 generates and outputs droplets 134. The droplets can include, tin, though droplets of other material can be utilized without departing from the scope of the present disclosure. The droplets 134 move at a high rate of speed toward the droplet receiver 106.

The droplet generator 102 periodically emits a droplet 134. The view of FIG. 2A illustrates five droplets 134. One of the droplets is at a laser irradiation point location within the EUV light generation chamber 104.

After passing through the laser irradiation point, the droplets 134 are received by the droplet receiver 106. The droplet receiver 106 may include a droplet reservoir. The droplets 134 travel into the droplet receiver 106, impact a back wall of the droplet receiver 106, and drop into the droplet reservoir. Other configurations for a droplet receiver 106 can be utilized without departing from the scope of the present disclosure.

The laser 111 is positioned behind the collector 114. During operation, the laser 111 outputs pulses of laser light 129. The pulses of laser light 129 are focused on a point through which the droplets pass on their way from the droplet generator 102 to the droplet receiver 106. Each pulse of laser light 129 is received by a droplet 134 at the laser irradiation point. When a droplet 134 receives the pulse of laser light 129, the energy from the laser pulse generates a high-energy plasma from the droplet 134. The high-energy plasma outputs extreme ultraviolet radiation.

In some embodiments, the laser 111 is a carbon dioxide ($CO_2$) laser. The $CO_2$ laser emits radiation or laser light 129 with a wavelength centered around 9.4 μm or 10.6 μm. The laser 111 can include lasers other than carbon dioxide lasers and can output radiation with other wavelengths than those described above without departing from the scope of the present disclosure.

In some embodiments, the laser 111 irradiates each droplet 134 with two pulses. A first pulse causes the droplet 134 to flatten into a disk like shape. The first pulse may be termed a "flattening pulse". The second pulse may be termed a "plasmatizing pulse". The second pulse causes the droplet 134 to form a high temperature plasma. The second pulse is significantly more powerful than the first pulse. The laser 111 and the droplet generator 102 are calibrated so that the laser 111 emits pairs of pulses such that each droplet 134 is irradiated with a pair of pulses.

In the example of FIG. 2A, the droplet 134 at the laser irradiation point has been irradiated by the flattening pulse. The irradiated droplet 134 is flattened the general shape of a disk. In the view of FIG. 2A, the flattened droplet is tilted relative to horizontal.

Although FIG. 2A illustrates a single laser 111, in practice there may be two lasers. The first laser may emit the flattening pulse. The second laser may emit the plasmatizing pulse. The laser 111 can irradiate droplets 134 in a manner other than described above without departing from the scope of the present disclosure. For example, the laser 111 may irradiate each droplet 134 with a single pulse or with more pulses than two. Moreover, the primary laser here can not only cause the droplet to form into disk-like shape but also may cause the droplet to form into a mist or vapor state.

FIG. 2B illustrates EUV light 117 being emitted from the droplet 134 receiving the laser light pulse 136. When the droplets 134 are converted to a plasma, the droplets 134 output EUV light 117. In an example in which the droplets 134 are tin, the droplets 134 output EUV light 117 with a wavelength centered between 10 nm and 15 nm. More particularly, in some embodiments, the tin plasma emits EUV light with a central wavelength of 13.5 nm. Materials other than tin can be used for the droplets 134 without departing from the scope of the present disclosure. Such other materials may generate extreme ultraviolet radiation with wavelengths other than those described above without departing from the scope of the present disclosure.

In some embodiments, the EUV light 117 output by the droplets 134 scatters in many directions. The photolithography system 100 utilizes the collector 114 to collect the scattered EUV light 117 from the plasma and output the EUV light 117 toward a photolithography target.

In some embodiments, the collector 114 is a parabolic or elliptical mirror. The scattered EUV light 117 is collected and reflected by the parabolic or elliptical mirror with a trajectory toward a scanner (not shown in FIGS. 2A and 2B). The scanner utilizes a series of optical conditioning devices such as mirrors and lenses to direct the extreme ultraviolet radiation to the photolithography mask. The EUV light 117 reflects off of the mask onto a photolithography target. The EUV light 117 reflected from the mask patterns a photoresist or other material on a semiconductor wafer. For purposes of the present disclosure, particularities of the mask and the various configurations of optical equipment in the scanner are not shown.

In some embodiments, the collector 114 includes a central aperture 128. The pulses of laser light 129 pass from the laser 111 through the central aperture 128 toward the stream of droplets 134. This enables the collector 114 to be positioned between the laser 111 and the scanner.

When the plasmatizing laser pulse irradiates the flattened droplet 134, the flattened droplet 134 will become a plasma. The energy and timing of the plasmatizing pulse also causes droplet particles 138 to scatter from the flattened droplet 134. Some of the droplet particles 138 will travel through the aperture 132 into the scanner 108. The droplet particles that travel through the aperture 132 into the scanner 108 may eventually land on and contaminate the reticle 112 or sensitive scanner optics 110.

Additionally, some of the droplet particles 138 from the plasmatized droplet 134 will land on the interior surface of the collector mirror 114. Some of the particles from the plasmatized droplet 134 will land on the interior surface of the conical enclosure 130. These droplet particles are debris that contaminate the collector mirror 114 and the conical enclosure 130. An accumulation of this debris may significantly reduce the reflectivity of the interior surface of the collector 114. Furthermore, accumulation of droplet debris on the interior surfaces of the conical enclosure 130 and the collector 114 can result in droplet debris becoming dislodged and traveling through the aperture 132 into the scanner 108.

The detection light source 120 and the light sensor 122 cooperate to detect debris particles 138 passing into the scanner 108 from the EUV light generation chamber 104 via the aperture 132. It may be very beneficial to place the detection light source 120 and the light sensor 122 adjacent to the aperture 132 because all debris particles passing from the EUV light generation chamber 104 into the scanner 108 will pass through the aperture 132. Accordingly, placing the detection light source 120 and the light sensor 122 adjacent to the aperture 132 enables effective detection of debris particles 138 passing into the scanner 108 from the EUV light generation chamber 104.

As described previously, the light detection source 120 can be configured to output detection light 140. The detection light source 120 can include one or more lasers, one or more LEDs, or other suitable light sources. The light sensor 122 is configured to detect the interaction of debris particles 138 with the detection light 140. The interaction of debris particles 138 with the detection light 140 can include detecting an interruption of the detection light 140 or detecting light emitted from the debris particles 138 responsive to being excited by the detection light 140. As will be set forth in the following figures, various arrangements and configurations of a light detection source 120 and a light sensor 122 can be utilized in accordance with principles of the present disclosure.

Figure 3A:
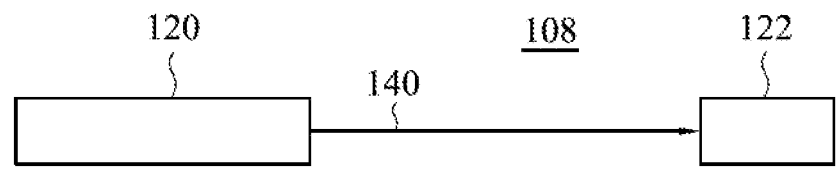
FIGS. 3A and 3B are illustrations of a debris detection system within a scanner of an EUV photolithography system, in accordance with some embodiments.

FIG. 3A is a side view of a detection light source 120 and a light sensor 122, according to one embodiment, in accordance with some embodiments. In the example of FIG. 3A, the light detection source includes a laser. The light sensor 122 includes one or more of a photodiode, a photodetector, a charge coupled device, or another type sensor capable of sensing light emitted by the detection light source 120. The light detection source 120 and the light sensor 122 may be positioned adjacent to an aperture or intermediate focus of the EUV light generation chamber 104. Alternatively, the light detection source 120 and the light sensor 122 may be positioned elsewhere within the scanner 108 or the EUV light generation chamber 104.

In FIG. 3A, the light detection source 120 outputs a detection light 140. In the example of FIG. 3A, the detection light 140 is laser light. The laser light is directed at the light sensor 122. The laser light is received by and sensed by the light sensor 122. The laser light travels across an expected path of debris particles 138 from the EUV light generation chamber 104. In some embodiments, the laser light is directed substantially perpendicular to an axis of the collector 114, though other angles can be utilized without departing from the scope of the present disclosure.

Figure 3B:
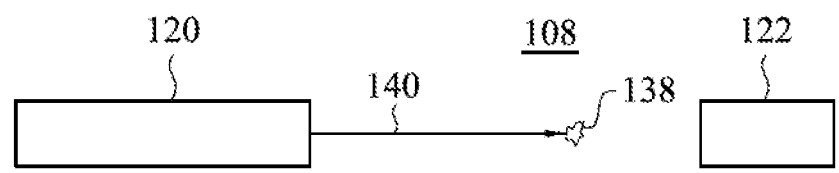

In FIG. 3B, a debris particle 138 has travelled from the EUV light generation chamber 104 into the scanner 108. The debris particle 138 travels directly into the path of the detection light 140 between the detection light source 120 and the light sensor 122. The light sensor 122 briefly detects an interruption in the detection light 140. The light sensor 122 outputs sensor signals indicative of the interruption in the detection light 140.

In one example, the light sensor 122 continuously senses the amount of energy received in the laser light. When the debris particle 138 passes through the detection light 140, the interruption results in less light energy received by the light sensor 122. This reduction in sensed light is indicative of the debris particle 138 passing from the EUV light generation chamber 104 into the scanner 108. While FIG. 3B illustrates a complete interruption in the detection light 140, in practice, the interruption may only partially include the detection light 140. If the debris particle 138 is smaller than the diameter of the laser beam, then the light sensor 122 will detect a reduction in receipt energy, but not a total absence of received energy.

Figure 4:
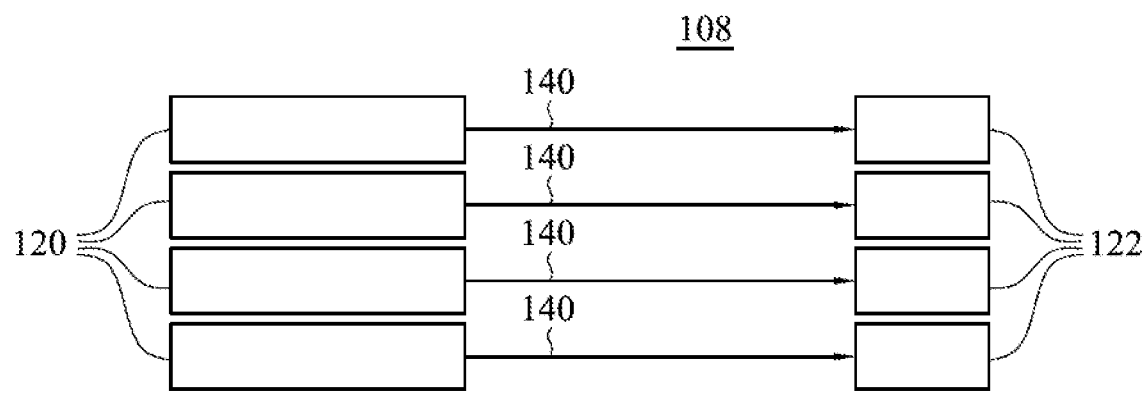
FIG. 4 is an illustration of a debris detection system within a scanner of an EUV photolithography system, in accordance with some embodiments.

FIG. 4 is a top view of an arrangement of a plurality of detection light sources 120 and a plurality of light sensors 122, in accordance with some embodiments. The detection light sources 120 may be lasers. The light sensors 122 include one or more of a photodiode, a photodetector, a charge coupled device, or another type sensor capable of sensing light emitted by the detection light sources 120. The detection light sources 120 and the light sensors 122 may be positioned adjacent to an aperture or intermediate focus of the EUV light generation chamber 104. Alternatively, the light detection sources 120 and the light sensors 122 may be positioned elsewhere within the scanner 108 or the EUV light generation chamber 104. Each pair of a detection light source 120 and a light sensor 122 may detect debris particles 138 substantially as described in relation to FIGS. 3A and 3B.

The detection light sources 120 are arranged such that their laser beams cover an area through which detection particles 138 may pass as the travel into or through the scanner 104. In the example of FIG. 4, for detection light sources 120 are arranged side-by-side. In practice, an arrangement of detection light sources 120 may include fewer or more light sources than four. The range of the light sources 120 may result in more effective sensing of debris particles 138 that enter the scanner 104. Other arrangements can be utilized without departing from the scope of the present disclosure.

Figure 5:
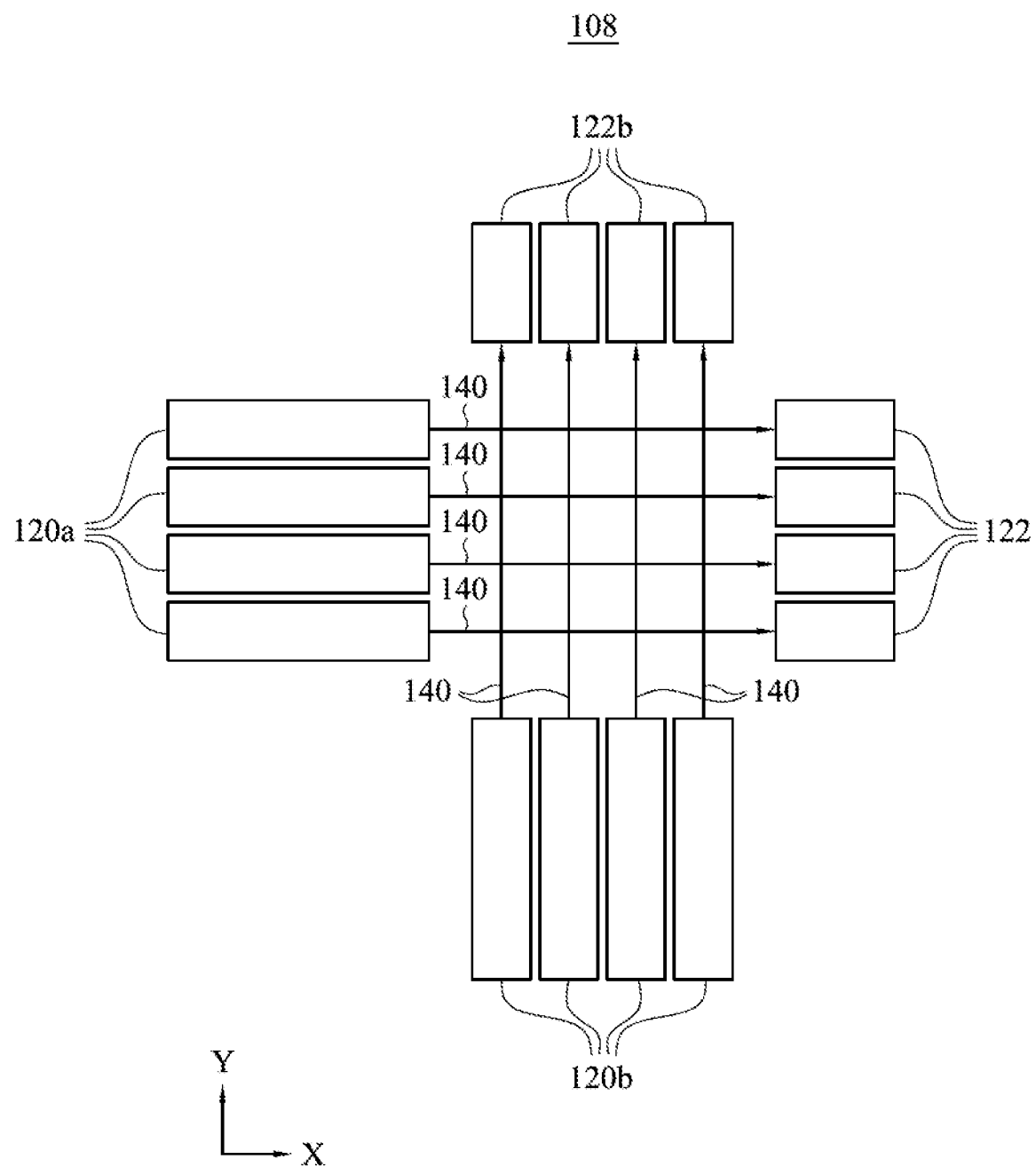
FIG. 5 is an illustration of a debris detection system within a scanner of an EUV photolithography system, in accordance with some embodiments.

FIG. 5 is a top view of an arrangement of a plurality of detection light sources 120a and 120b and corresponding light sensors 122a and 122b, in accordance with some embodiments. A first group of detection light sources 120a outputs detection light 140 in a next direction. The first group of light sensors 122a receives the detection light 140 output by the first group of light sources 120a. A second group of detection light sources 122b outputs detection light in a Y direction substantially perpendicular to the X direction. A second group of light sensors 122b receives the detection light 140 from the second group of detection light sources 122b. The detection light sources 120a and 120b and the light sensors 122a and 122b operates to detect debris particles 138 substantially as described in relation to FIGS. 3 and 4.

In some embodiments, the first group of detection light sources 120a are vertically offset from the second group of detection light sources 120b. A Z direction may be considered to be a direction between a central axis of the collector 114 and the aperture 132. The Z direction is perpendicular to both the X direction and the Y direction. The first group of detection light sources 120a and the second group of detection light sources 120b are offset from each other in the Z direction. Alternatively, the first and second groups of detection light sources 120a and 120b may lie in a same X-Y plane.

Figure 6A:
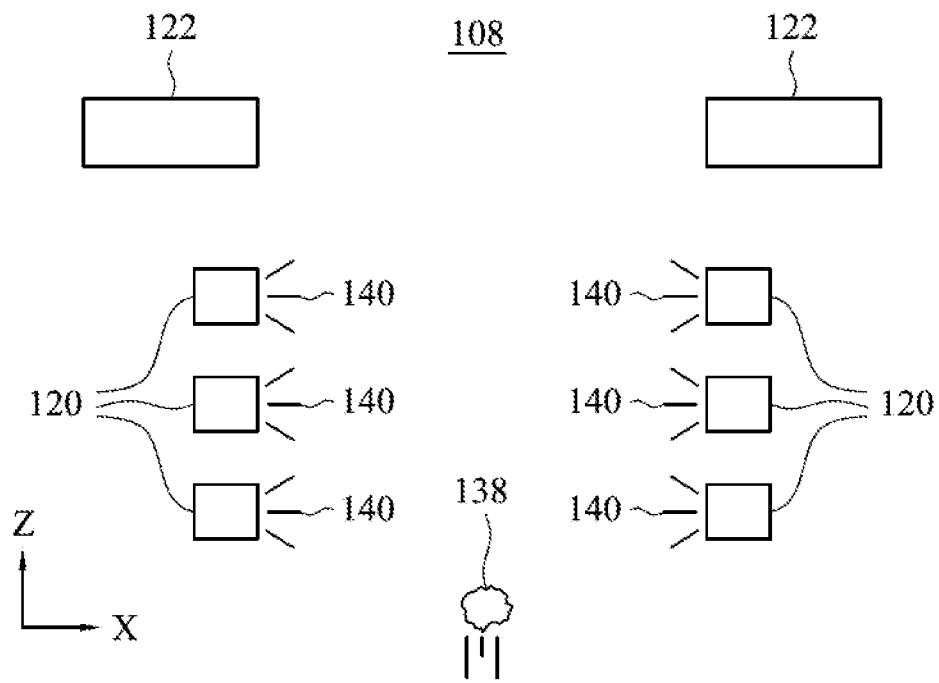
FIGS. 6A-6C are illustrations of a debris detection system within a scanner of an EUV photolithography system, in accordance with some embodiments.

FIG. 6A is a side view illustrating a plurality of detection light sources 120 and light sensors 122, in accordance with some embodiments. In the example of FIG. 6A, the detection light sources 120 are LEDs. However, detection light sources other than LEDs can be utilized without departing from the scope of the present disclosure. The light sensors 122 can include photodiodes, charge coupled devices, photodetectors, or other types of light sensors.

In FIG. 6A, a debris particle 138 is moving upward in the Z direction from the EUV light generation chamber 104. The debris particle 138 has not yet passed adjacent to the detection light sources 120. However, the debris particle 138 has a trajectory to pass adjacent to the detection light sources 120.

Figure 6B:
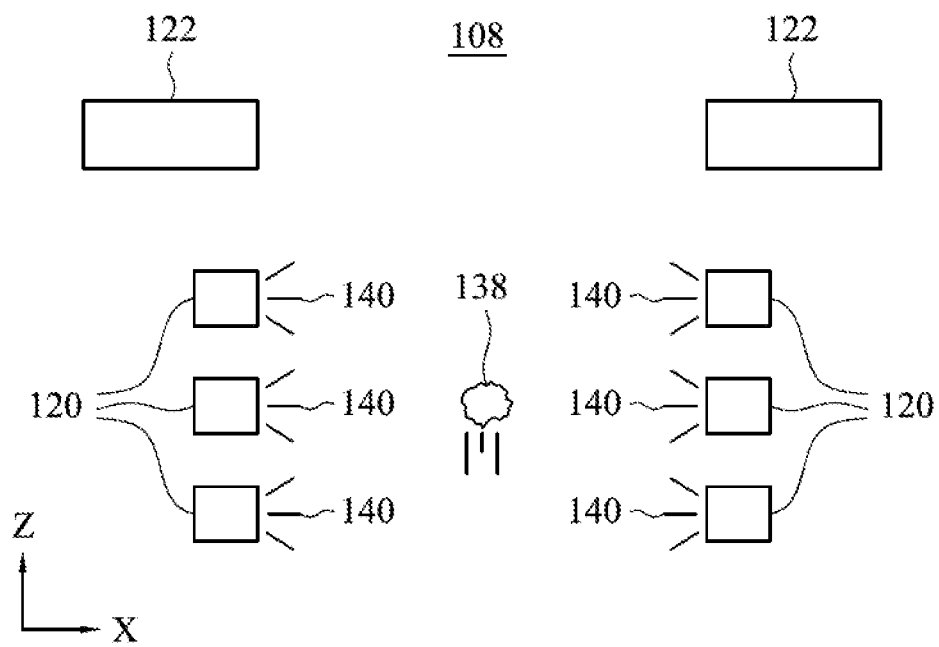

In FIG. 6B, the debris particle 138 has continued upward and is not positioned between the detection light sources 140. The detection light sources emit detection light 140. While the debris particle 138 passes adjacent to the detection light sources, the debris particle 138 absorbs some of the detection light 140. The detection light 140 excites some electrons in the debris particle 138. In this case, the detection light 140 is an excitation light. The excitation light causes the electrons of the debris particle 138 to jump from a low energy level to a higher energy level. This excitation of electrons is useful for detecting the presence of the debris particle 138.

Figure 6C:
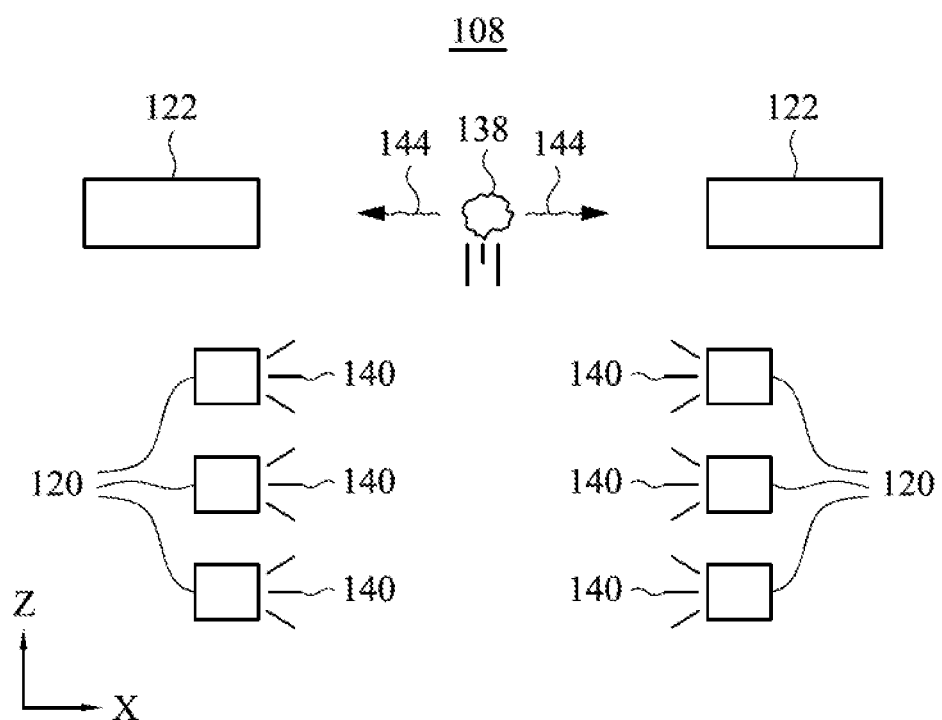

In FIG. 6C, the debris particle 138 has continued upward. The debris particle 138 is now adjacent to the light sensors 122. The light sensors 122 are offset vertically in the Z direction from the detection light sources 120. Because the debris particle 138 has absorbs some of the detection light 140, the excited electrons of the debris particle 138 begin to emit light 144. The wavelength or energy of the light 144 is characteristic of the material of the debris particle 138. The light 144 is sensed by the light sensors 122.

The light sensors 122 generate sensor signals indicative of the wavelength of light 144 received from the debris particle 138. The light sensors 122 may pass the sensor signals or sensor data to the control system 118. The control system 118 may determine the material of the debris particle 138 based on the wavelength or wavelengths of the light 144 emitted from the debris particle 138. In one example, the debris particle 138 is tin from a tin droplet 134 in the EUV light generation chamber 104. The control system 118 determines that the debris particle 138 is 10 based on the spectrum of light 144 emitted from the excited debris particle 138. In some embodiments, the light sensors 122 may include processing circuitry to determine the material of the debris particle 138. Other arrangements of detection light sources 120 and light sensors 122 can be utilized without departing from the scope of the present disclosure.

Figure 7:
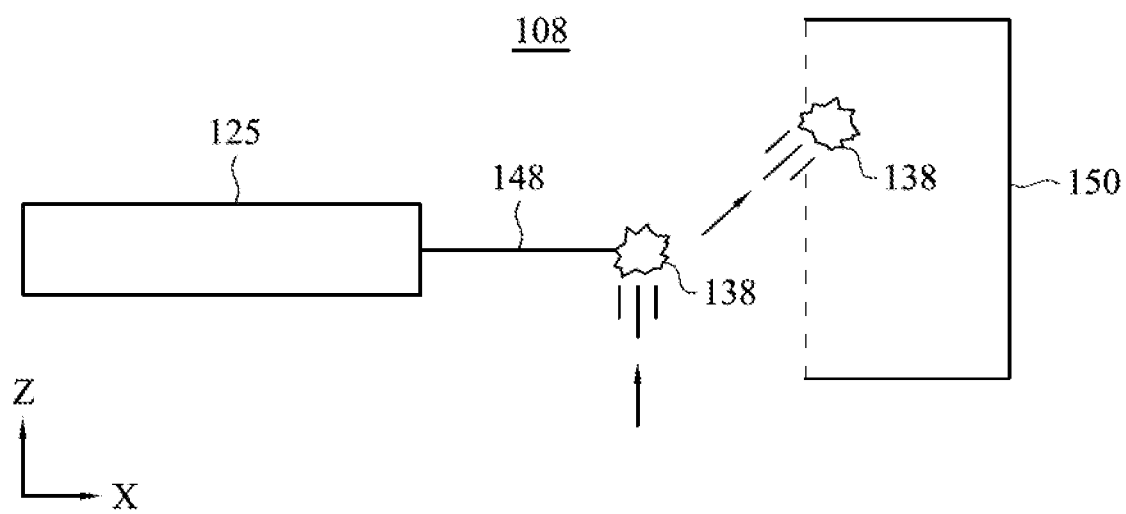
FIG. 7 is an illustration of a debris prevention system within a scanner of an EUV photolithography system, in accordance with some embodiments.

FIG. 7 is a side view of a cleaning laser 125 positioned within a scanner 108 of the EUV photolithography system, in accordance with some embodiments. The cleaning laser 125 may be positioned in the scanner 104 downstream from detection light sources 120. Alternatively, the function of the cleaning laser 125 may be performed by detection light sources 120.

The cleaning laser 125 outputs a high energy laser beam 148 into the expected path of debris particles 138 traveling through the scanner 104. When the high energy laser beam 148 impacts a debris particle 138, the high-energy laser beam 148 may alter the trajectory of the debris particle 138. Alternatively, the high-energy laser beam 148 may substantially disintegrate the debris particle 138.

In the example of FIG. 7, a debris particle 138 is initially traveling upward in the Z direction. The debris particle 138 passes into the high-energy laser beam 148. The high-energy laser beam 148 impacts or irradiates the debris particle 138. After the debris particle 138 has been impacted by the laser beam 148, the trajectory of the debris particle 138 is altered. This altering of the trajectory of the debris particle 138 can help ensure that the debris particle 138 does not continue on to contaminate the reticle 112 or the scanner optics 110.

In some embodiments, a debris trap 150 is positioned adjacent to the cleaning laser 125. The debris trap 150 is positioned so that after the trajectory of a debris particle 138 is altered, the debris particle 138 will traveling to the debris trap 150. The debris trap 150 traps the debris particle 138 and ensures that the debris particle 138 will not continue on to contaminate the sensitive reticle 112 or scanner optics 110.

The cleaning laser 125 may be focused onto a spot within the scanner 108 through which debris particles 138 are likely to travel. This focusing of the laser beam 148 may result in destruction of the debris particles 138 that pass through the focal point. Destruction of the debris particles 138 may correspond to disintegration of the debris particle 138.

As set forth previously, the detection light source 120 may also act as a cleaning laser. The detection light 140 can alter the trajectory of debris particles 138 or may dissolve debris particles 138.

Figure 8:
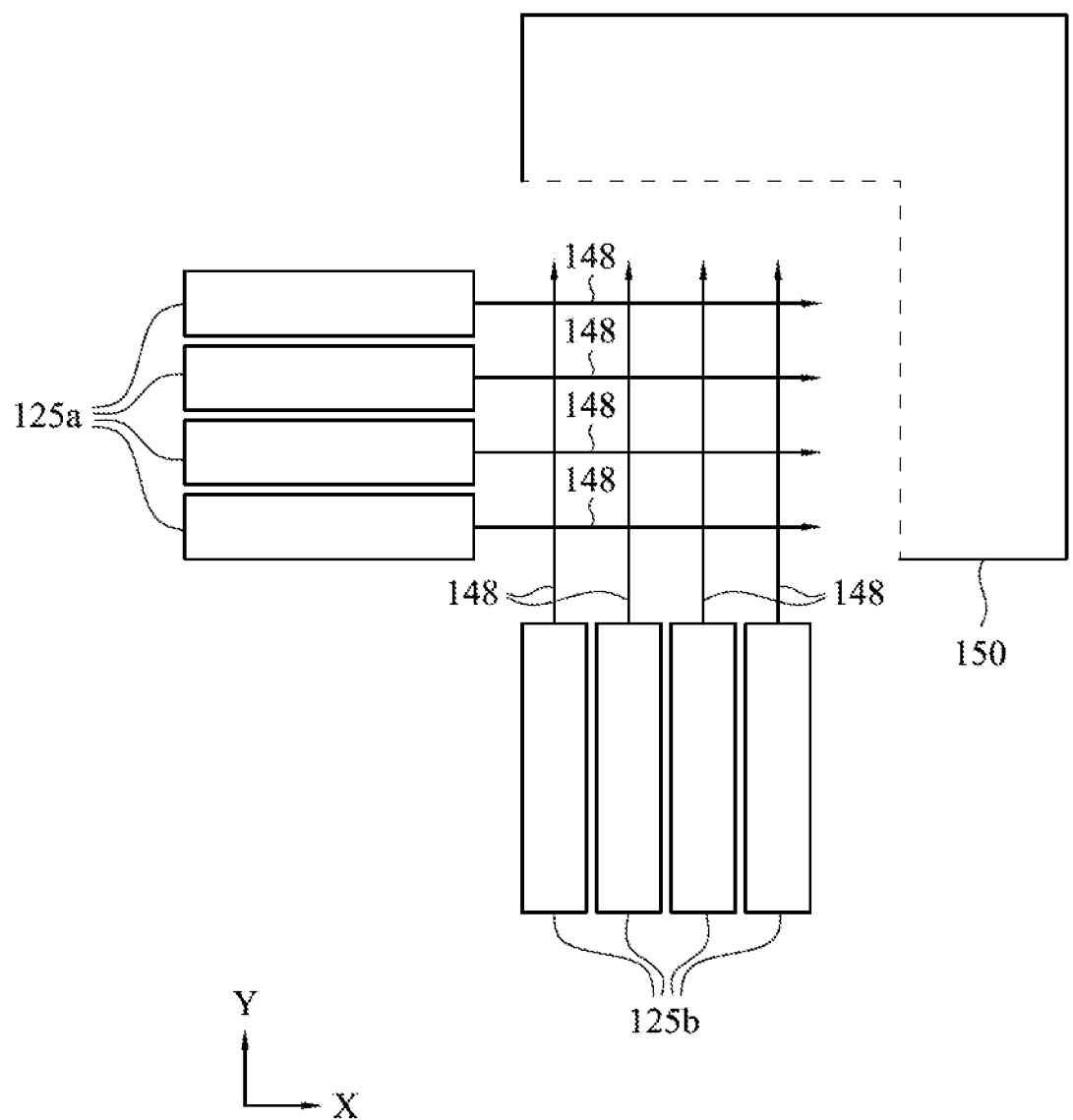
FIG. 8 is an illustration of a debris prevention system within a scanner of an EUV photolithography system, in accordance with some embodiments.

FIG. 8 is a top view of a plurality of cleaning lasers 125 positioned in a scanner 108, in accordance with one embodiment. The cleaning lasers 125 may include a first group of cleaning lasers 125a and a second group of cleaning lasers 125b. The cleaning lasers 125a are oriented so that high-energy laser beams 148 are directed in the X direction. The cleaning lasers 125b are oriented so that high-energy laser beams 148 are directed in the Y direction. The laser beams 148 of the first and second groups of cleaning lasers 125a and 125b form an area through which if debris particles 138 travel they will be either destroyed or redirected into a debris trap 150. The first and second groups of cleaning lasers 125a and 125b may be vertically offset from each other in a Z direction. Other arrangements and configurations of cleaning lasers 125 may be utilized without departing from the scope of the present disclosure.

Figure 9:
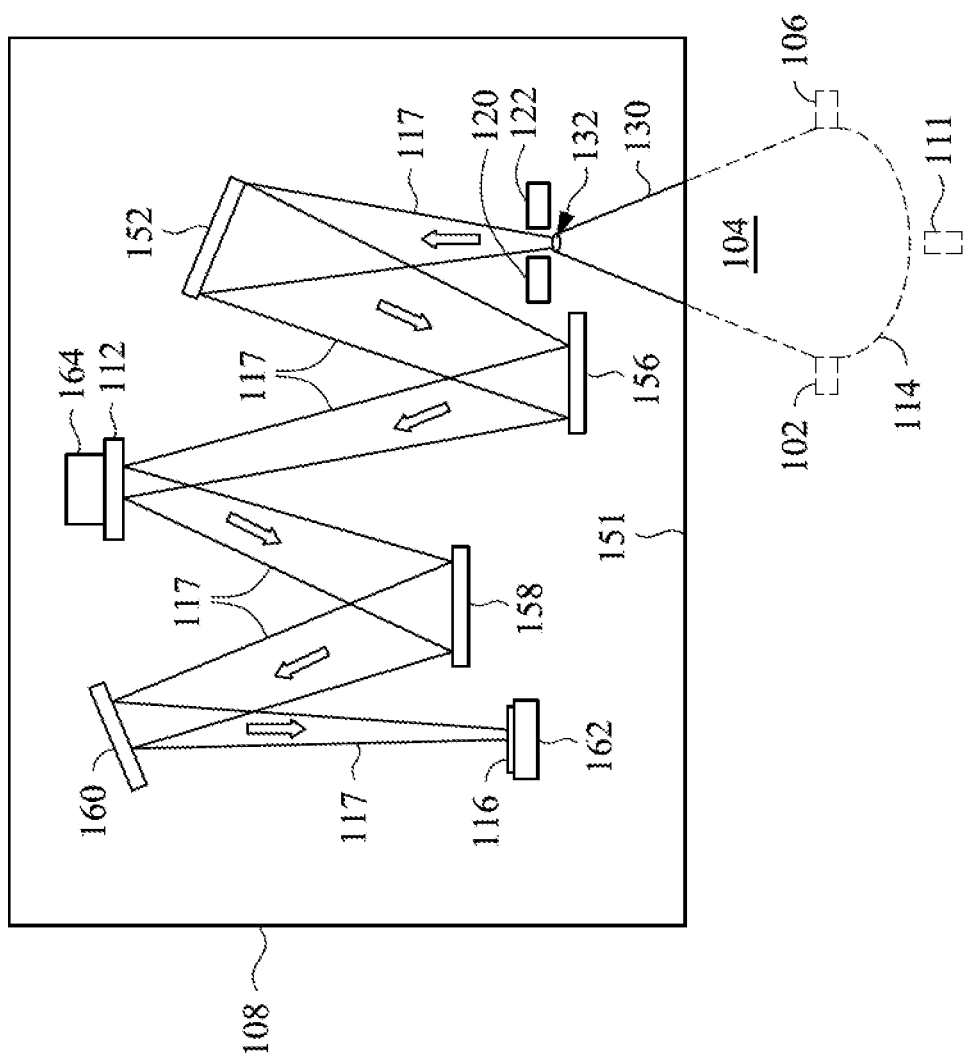
FIG. 9 is an illustration of a scanner of an EUV photolithography system, in accordance with some embodiments.

FIG. 9 is an illustration of a scanner 108 of an EUV photolithography system, in accordance with some embodiments. The scanner 108 includes a floor 151. A portion of the conical enclosure 130 of the EUV generation chamber 104 protrudes through the floor 151 into the scanner 108. A portion of the conical enclosure 130 together with the collector 114, the droplet generator 102, the droplet generator 106, and the laser 111 are positioned below the floor 151 and are shown in dashed lines.

EUV light 117 is generated within the EUV generation chamber 104 in the manner described previously. The EUV light exits the aperture 132 and the conical enclosure 130. The EUV light 117 is directed to a first mirror 152. The mirror 152 reflects the EUV light 117 to a second mirror 156. The second mirror 156 reflects the EUV light 117 onto the reticle 112. The exposure surface of the reticle 112 faces downward. The EUV light 117 reflects off of the patterned exposure surface of the reticle 112 toward a mirror 158. The mirror 158 reflects the EUV light 117 to a mirror 160. The mirror 160 reflects and focuses the EUV light 117 onto the wafer 116. The mirrors 152, 156, 158, and 160 are examples of the scanner optics 110 described in relation to FIG. 1. In practice, some or all of the mirrors 152, 156, 158, and 160 act as focusing lenses to condition and direct the EUV light to impact the reticle 112 in a selected manner and to focus and direct the EUV light 117 from the reticle 112 onto the wafer 116. Though not shown in FIG. 9, the scanner optics may include refractive surfaces in addition to reflective surfaces. The scanner optics may have various components or configurations without departing from the scope of the present disclosure.

A chuck 162 supports the wafer 116 within the scanner 108. A chuck 164 holds the reticle 112 within the scanner 108. The scanner 108 may also include various components for transferring the wafer 116 and the reticle 112. The scanner 108 may also include various components for automatically flowing cleansing fluids to clean the surfaces of the scanner optics and the reticle 112.

A detection light source 120 and a light sensor 122 are positioned adjacent to the aperture 132. The detection light source 120 and the light sensor 122 cooperate to detect the number of debris particles that enter the scanner 108. The detection light source 120 may also act as a cleaning light source that adjusts the trajectory of debris particles 138 or destroys debris particles 138. Alternatively, a cleaning laser 125 may be positioned within the scanner 108 to adjust the trajectory or to destroy debris particles 138. A debris trap 150 may also be positioned within the scanner 108 to trap debris if trajectory has been altered by the cleaning laser 125.

Figure 10:
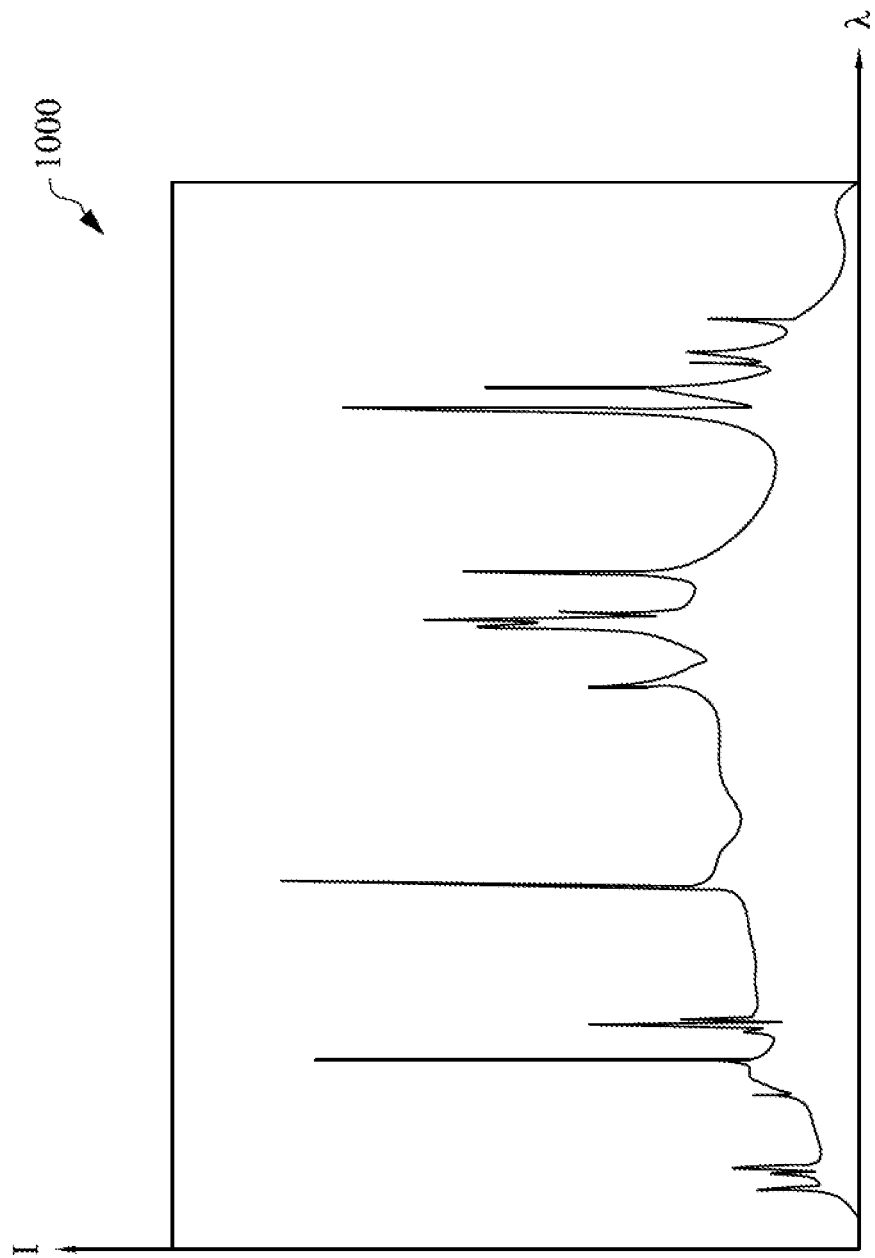
FIG. 10 is a graph of emission lines of a debris particle, in accordance with some embodiments.

FIG. 10 is a graph 1000 illustrating emission lines associated with light received by a light sensor 122, in accordance with some embodiments. In one example, the graph 1000 illustrates emission lines associated with photons received by the light sensors 122 of FIGS. 6A and 6B. The higher the peaks, the greater the intensity of light of the corresponding wavelength received by the light sensors 122. In one example, the emission lines represent the emission spectrum of the material of the droplets 134. In practice, an emission spectrum corresponding to the material of the droplets 134 may be different than shown in FIG. 10. The control system 118 can analyze the sensor signals output by the light sensors 122 to determine the material of the debris particles 138.

Figure 11:
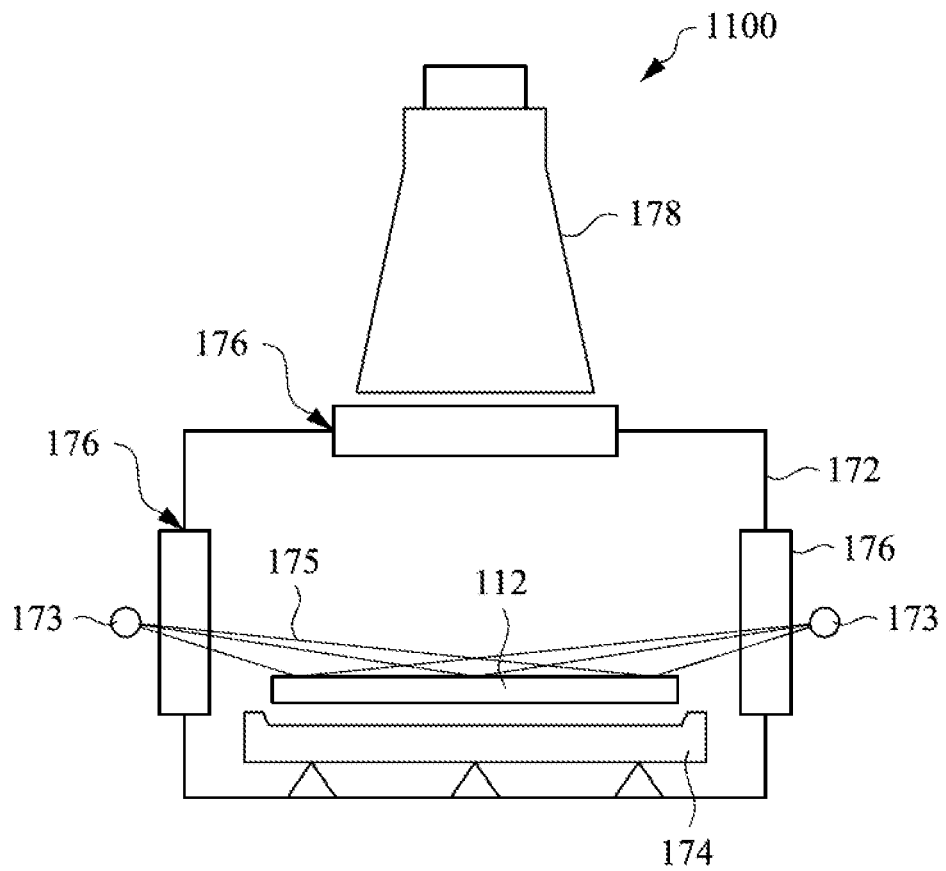
FIG. 11 is an illustration of a reticle backside inspection system, in accordance with some embodiments.

FIG. 11 illustrates a reticle backside inspection (RBI) system 1100, in accordance with some embodiments. The RBI system 1100 includes a housing 172. Vacuum conditions may be maintained within the housing 172. The reticle 112 is positioned on the baseplate 174 within the RBI housing 172. The backside of the reticle 112 is facing upward. Windows 176 are included in the housing 172. Illumination sources 173 then illuminate the backside of the reticle 112 via the windows 176. The backside of the reticle 112 is irradiated with light 175 via the windows 176. An imaging system 178 detects light reflected off of the back surface of the reticle 112. The imaging system may include a charge coupled device and an objective lens, or other suitable optical light sensing equipment. The imaging system 178 is able to detect the precise location of debris particles on the backside of the reticle 112. Cleaning operations may then be implemented to clean the debris particles 138 off of the backside of the reticle 112.

In some embodiments, the reticle 112 is only loaded into the RBI system 1100 after the light sensors 122 has detected a sufficiently large number of debris particles 138 entering the scanner 104. At this point, the reticle 112 may be transferred from the scanner 108 to the RBI system 1100.

The RBI system can then analyze the backside of the reticle 112 to detect debris particles.

Figure 12:
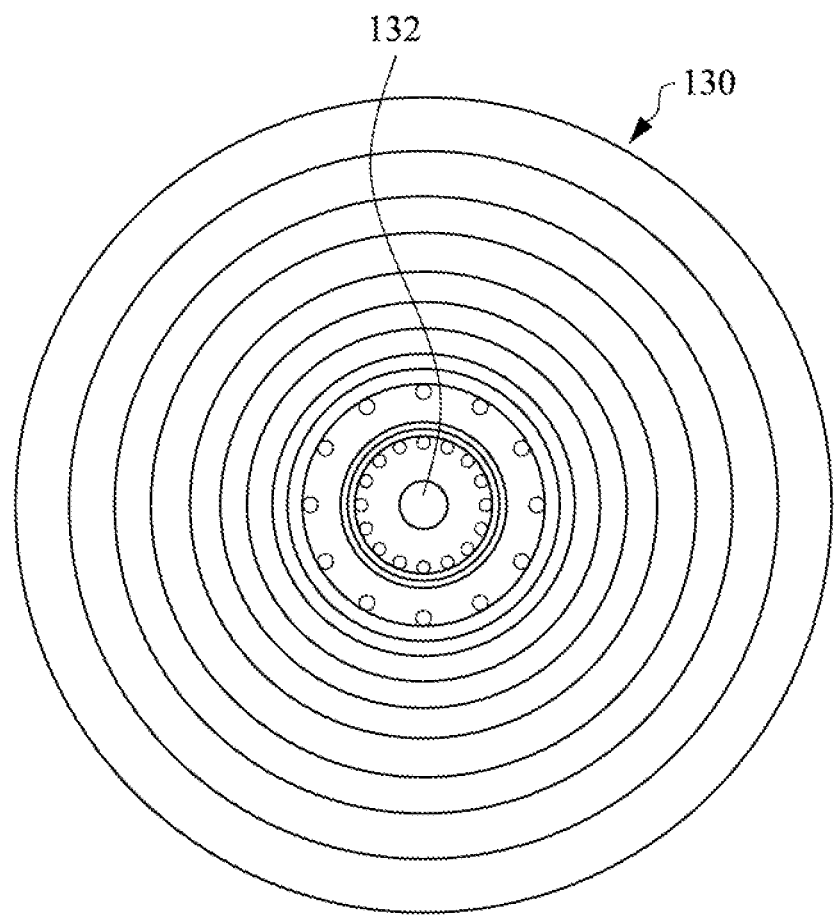
FIG. 12 is an illustration of an interior of a conical enclosure of an EUV light generation chamber, in accordance with some embodiments.

FIG. 12 is an illustration of an interior of the conical enclosure 130 of an EUV light generation chamber 104. The aperture 132, or intermediate focus, is visible. Debris may accumulate on the interior of the conical enclosure 130. Eventually this debris may break free and contaminate the reticle 112 or the scanner optics 110. When the light sensor 122 detects debris particles 138 passing from the aperture 132 into the scanner 108, the control system 118 can initiate cleaning measures to clean the interior surface of the conical enclosure 130. This can include flowing cleaning fluids, as described previously, onto the interior surfaces of the conical enclosure 130. The cleaning fluids can remove the debris particles from the interior surface of the conical enclosure 130. This can help reduce contamination of the reticle 112 and the scanner optics 110.

Figure 13:
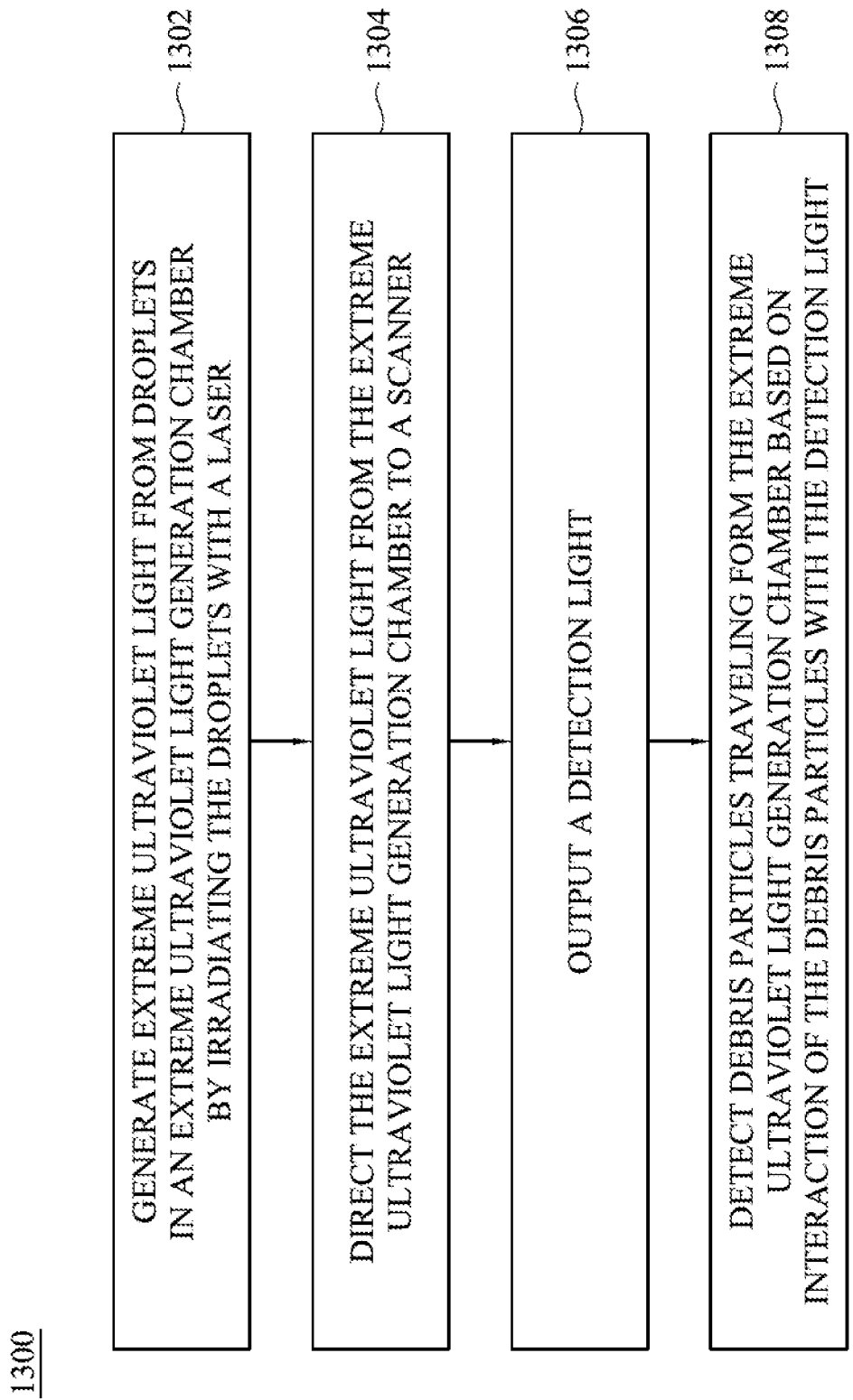
FIG. 13 is a flow diagram of a method for cleaning an EUV reticle, in accordance with some embodiments.

FIG. 13 is a flow diagram of a method 1300 for operating an EUV photolithography system, in accordance with some embodiments. The method 1300 can utilize processes, components, and systems described in relation to FIGS. 1-12. At 1302, the method 1300 includes generating extreme ultraviolet light from droplets in an extreme ultraviolet light generation chamber by irradiating the droplets with a laser. One example of droplets are the droplets 134 of FIG. 2B. One example of an extreme ultraviolet light generation chamber is the extreme ultraviolet light generation chamber 104 of FIG. 2B. One example of a laser is the laser 111 of FIG. 2B. At 1304, the method 1300 includes directing the extreme ultraviolet light from the extreme ultraviolet light generation chamber to a scanner. One example of a scanner is the scanner 108 of FIG. 1. At 1306, the method 1300 includes outputting a detection light. At 1308, the method 1300 includes detecting debris particles traveling form the extreme ultraviolet light generation chamber based on interaction of the debris particles with the detection light. One example of debris particles are the debris particles 138 of FIG. 2B.

Figure 14:
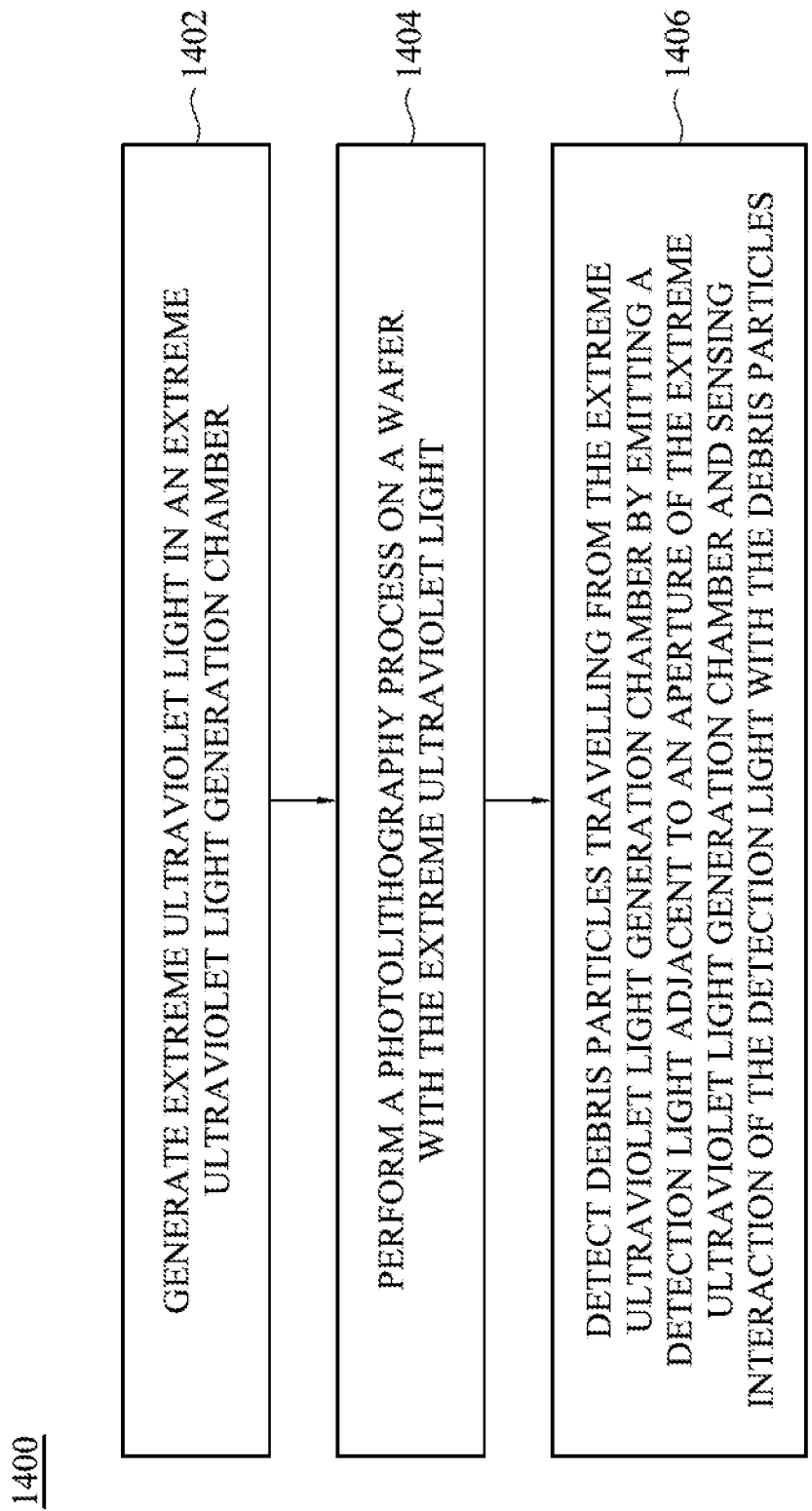
FIG. 14 is a flow diagram of a method for cleaning an EUV reticle, in accordance with some embodiments.

FIG. 14 is a flow diagram of a method 1400 for operating an EUV photolithography system, in accordance with some embodiments. At 1402, the method 1400 includes generating extreme ultraviolet light in an extreme ultraviolet light generation chamber. One example of an extreme ultraviolet light generation chamber is the extreme ultraviolet light generation chamber 104 of FIG. 1. At 1404, the method 1400 includes performing a photolithography process on a wafer with the extreme ultraviolet light. One example of a wafer is the wafer 116 of FIG. 1. At 1406, the method 1400 includes detecting debris particles travelling from the extreme ultraviolet light generation chamber by emitting a detection light adjacent to an aperture of the extreme ultraviolet light generation chamber and sensing interaction of the detection light with the debris particles. One example of an aperture is the aperture 132 of FIG. 2A.

Embodiments of the present disclosure provide many benefits to EUV photolithography systems. Embodiments of the present disclosure utilize light sensors to detect debris particles within an EUV photolithography system. A detection light source and a light sensor are positioned within a scanner of the EUV photolithography system. The detection light source emits a detection light in a path of travel of debris particles from an EUV light generation chamber. When the debris particles pass through the detection light, the light sensor detects that the debris particle have passed through the light. The EUV system can determine in real time how many particles are passing from the EUV generation chamber into the scanner. This provides several benefits. For example, upon detecting a high rate of debris particles passing into the scanner, the EUV system can adjust EUV generation parameters in real time to reduce the number of debris particles. Additionally, the EUV photolithography system can automatically initiate cleaning processes to clean one or more of an EUV reticle, optical equipment within the scanner, or a collector within the EUV generation chamber before large amounts of debris particles have accumulated. This can avoid more expensive and time consuming cleaning procedures to clean the reticle or other equipment. Furthermore, photolithography processes are properly performed, leading to increases in wafer yields and better performance of integrated circuits.

In some embodiments, a method includes generating extreme ultraviolet light from droplets in an extreme ultraviolet light generation chamber by irradiating the droplets with a laser and directing the extreme ultraviolet light from the extreme ultraviolet light generation chamber to a scanner. The method includes outputting a detection light and detecting debris particles traveling form the extreme ultraviolet light generation chamber based on interaction of the debris particles with the detection light.

In some embodiments, a method includes generating extreme ultraviolet light in an extreme ultraviolet light generation chamber and performing a photolithography process on a wafer with the extreme ultraviolet light. The method includes detecting debris particles travelling from the extreme ultraviolet light generation chamber by emitting a detection light adjacent to an aperture of the extreme ultraviolet light generation chamber and sensing interaction of the detection light with the debris particles.

In some embodiments, a photolithography system includes an extreme ultraviolet light generation chamber and extreme ultraviolet light generation equipment configured to generate extreme ultraviolet light in the extreme ultraviolet light generation chamber. The system includes a scanner coupled to the extreme ultraviolet light generation chamber and configured to receive the extreme ultraviolet light from the extreme ultraviolet light generation chamber. The system includes a detection light source configured to output a detection light adjacent to an aperture and a light sensor configured to detect debris particles from the extreme ultraviolet light generation chamber by detecting interaction of the debris particles with the detection light.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
generating extreme ultraviolet light from droplets in an extreme ultraviolet light generation chamber by irradiating the droplets with a laser;
directing the extreme ultraviolet light from the extreme ultraviolet light generation chamber to a scanner via an aperture joining the extreme ultraviolet light generation chamber to the scanner;

altering a trajectory of debris particles traveling from the extreme ultraviolet light generation chamber by outputting, with a cleaning laser in the scanner, a particle disruption light across a path of travel of the extreme ultraviolet light and toward a debris trap in the scanner;

capturing, with the debris trap, debris particles impacted by the particle disruption light;

directing, with first optical conditioning devices within the scanner, the extreme ultraviolet light passed between a detection light source and a light sensor to a reticle within the scanner after; and directing, with second optical conditioning devices within the scanner, the extreme ultraviolet light from the reticle to a wafer;

outputting, with the detection light source in the scanner, a detection light across a path of travel of the extreme ultraviolet light and toward the light sensor in the scanner;

detecting debris particles traveling from the extreme ultraviolet light generation chamber into the scanner by detecting, with the light sensor, interaction of the debris particles with the detection light;

directing, with first optical conditioning devices within the scanner, the extreme ultraviolet light passed between the detection light source and the light sensor to the reticle within the scanner; and directing, with second optical conditioning devices within the scanner, the extreme ultraviolet light from the reticle to the wafer.

2. The method of claim 1, comprising detecting debris includes sensing emissions from the debris responsive to the detection light.

3. The method of claim 1, wherein detecting debris particles includes sensing an interruption in the detection light with the light sensor.

4. The method of claim 1, further comprising counting a number of debris particles that have traveled from the extreme ultraviolet light generation chamber into the scanner.

5. The method of claim 1, further comprising initiating a debris removal process responsive to detecting debris particles.

6. The method of claim 5, wherein the debris removal process includes flowing a cleaning fluid into the scanner.

7. The method of claim 1, further comprising adjusting extreme ultraviolet light generation parameters responsive to detecting debris particles.

8. The method of claim 7, wherein adjusting extreme ultraviolet light generation parameters includes one or more of:
  droplet speed;
  droplet size;
  laser position; and
  laser energy.

9. The method of claim 1, wherein the droplets include tin, wherein detecting debris particles includes detecting tin emissions responsive to the detection light.

10. The method of claim 1, wherein the cleaning laser is positioned downstream from the detection light source within the scanner.

11. The method of claim 10, comprising activating the cleaning laser responsive to detecting debris particles with the light sensor.

12. A method, comprising:
generating extreme ultraviolet light in an extreme ultraviolet light generation chamber;

performing a photolithography process on a wafer with the extreme ultraviolet light; and altering a trajectory of debris particles traveling from the extreme ultraviolet light generation chamber by outputting, with a first cleaning laser in a scanner coupled to the extreme ultraviolet light generation chamber, a first particle disruption light in a first direction across a path of travel of the extreme ultraviolet light and toward a debris trap in the scanner; and altering the trajectory of debris particles traveling from the extreme ultraviolet light generation chamber by outputting a second particle disruption light in a second direction transverse to the first direction across the path of travel of the extreme ultraviolet light and toward the debris trap in the scanner.

13. The method of claim 12, comprising capturing, with the debris trap, debris particles impacted by the first particle disruption light.

14. The method of claim 13, comprising detecting debris particles travelling from the extreme ultraviolet light generation chamber by emitting a detection light adjacent to an aperture of the extreme ultraviolet light generation chamber and sensing interaction of the detection light with the debris particles.

15. The method of claim 14, further comprising emitting the detection light from a laser or a light emitting diode.

16. The method of claim 14, wherein sensing interaction of the detection light includes detecting characteristic emissions from the debris particles.

17. The method of claim 14, further comprising adjusting extreme ultraviolet light generation parameters responsive to detecting debris particles.

18. A photolithography system, comprising:
an extreme ultraviolet light generation chamber;
extreme ultraviolet light generation equipment configured to generate extreme ultraviolet light in the extreme ultraviolet light generation chamber;
a scanner coupled to the extreme ultraviolet light generation chamber and configured to receive the extreme ultraviolet light from the extreme ultraviolet light generation chamber;
a first cleaning laser within the scanner and configured to alter a trajectory of the debris particles traveling from the extreme ultraviolet light generation chamber by outputting a first particle disruption light across a path of travel of the extreme ultraviolet light;
a second cleaning laser within the scanner and configured to alter the trajectory of the debris particles by outputting a second particle disruption light in a second direction transverse to the first direction across the path of travel of the extreme ultraviolet light; and
a debris trap in the scanner and configured to capture debris particles impacted by the particle disruption light.

19. The photolithography system of claim 18, comprising:
a detection light source configured to output a detection light adjacent to an aperture; and
a light sensor configured to detect debris particles from the extreme ultraviolet light generation chamber by detecting interaction of the debris particles with the detection light.

20. The photolithography system of claim 19, wherein the first cleaning laser is positioned downstream from the detection light source within the scanner.

* * * * *